United States Patent
Turner et al.

(10) Patent No.: US 10,532,927 B2
(45) Date of Patent: Jan. 14, 2020

(54) GRADED CATALYTIC-PROTECTIVE LAYER FOR AN EFFICIENT AND STABLE WATER-SPLITTING PHOTOCATHODE

(71) Applicant: Alliance for Sustainable Energy, LLC, Golden, CO (US)

(72) Inventors: John Augustus Turner, Broomfield, CO (US); Jing Gu, San Diego, CA (US); Jeffery Andrew Aguiar, Ammon, ID (US); Suzanne Ferrere, Evergreen, CO (US); Kenneth Xerxes Steirer, Edgewater, CO (US); Yong Yan, San Diego, CA (US); Chuanxiao Xiao, Lakewood, CO (US); James Luke Young, Golden, CO (US); Mowafak Al-Jassim, Littleton, CO (US); Nathan Richard Neale, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 88 days.

(21) Appl. No.: 15/865,874

(22) Filed: Jan. 9, 2018

(65) Prior Publication Data
US 2018/0194623 A1 Jul. 12, 2018

Related U.S. Application Data

(60) Provisional application No. 62/444,215, filed on Jan. 9, 2017.

(51) Int. Cl.
*B01J 23/28* (2006.01)
*B01J 27/051* (2006.01)
(Continued)

(52) U.S. Cl.
CPC .............. *C01B 3/042* (2013.01); *B01J 35/004* (2013.01); *B01J 35/0006* (2013.01);
(Continued)

(58) Field of Classification Search
CPC ........ B01J 35/004; B01J 23/28; B01J 27/051; B01J 27/057; C01B 3/042; C25B 9/08; C25D 5/50; H01L 31/0687; H01G 9/2031
(Continued)

(56) References Cited

U.S. PATENT DOCUMENTS 5,672,425 A * 9/1997 Sato .......................... G11B 5/72
428/332
6,211,113 B1 * 4/2001 Harth .................... B01J 37/0238
428/403
(Continued)

OTHER PUBLICATIONS

Benck, J. et al., "Amorphous Molybdenum Sulfide Catalysts for Electrochemical Hydrogen Production: Insights into the Origin of their Catalytic Activity," ACS Catalysis, vol. 2, 2012, pp. 1916-1923.
(Continued)

*Primary Examiner* — Melvin C. Mayes
(74) *Attorney, Agent, or Firm* — Michael A. McIntyre

(57) ABSTRACT

The present disclosure relates to a composition that includes, in order: a first layer that includes $MA_w$; a second layer that includes $MO_yA_z$; and a third layer that includes $MO_x$, where M includes a transition metal, A includes at least one of sulfur, selenium, and/or tellurium, w is between greater than zero and less than or equal to five, x is between greater than zero and less than or equal to five, y is between greater than zero and less than or equal to five, and z is between greater than zero and less than or equal to five. In some embodiments of the present disclosure, the transition metal may include at least one of molybdenum and/or tungsten. In some embodiments of the present disclosure, A may be sulfur.

20 Claims, 19 Drawing Sheets

(51) Int. Cl.
B01J 27/057 (2006.01)
C01B 3/04 (2006.01)
B01J 35/00 (2006.01)
C25B 9/08 (2006.01)
H01L 31/0687 (2012.01)
C25D 5/50 (2006.01)
C01B 13/02 (2006.01)
H01G 9/20 (2006.01)

(52) U.S. Cl.
CPC ............ *C01B 13/0207* (2013.01); *C25B 9/08* (2013.01); *C25D 5/50* (2013.01); *H01L 31/0687* (2013.01); *B01J 2523/00* (2013.01); *H01G 9/205* (2013.01); *H01G 9/2031* (2013.01); *Y02P 20/135* (2015.11)

(58) Field of Classification Search
USPC ........ 502/216, 220, 321; 428/688, 689, 698, 428/699
See application file for complete search history.

(56) References Cited

U.S. PATENT DOCUMENTS

| | | | | |
|---|---|---|---|---|
| 6,355,093 | B1* | 3/2002 | Schwartz | B01D 53/228 502/303 |
| 8,673,805 | B2* | 3/2014 | Anand | B01J 21/06 502/220 |
| 10,164,205 | B2* | 12/2018 | Kazlas | B82Y 20/00 |
| 2007/0103068 | A1* | 5/2007 | Bawendi | B82Y 20/00 313/506 |
| 2009/0274903 | A1* | 11/2009 | Addiego | B01D 53/864 428/337 |
| 2014/0060643 | A1* | 3/2014 | Martin | B01J 35/004 502/1 |
| 2014/0332374 | A1 | 11/2014 | Deutsch et al. | |
| 2015/0170914 | A1* | 6/2015 | Haukka | H01L 21/28264 438/478 |

OTHER PUBLICATIONS

Benck, J. et al., "Designing Active and Stable Silicon Photocathodes for Solar Hydrogen Production Using Molybdenum Sulfide Nanomaterials," Advanced Energy Materials, vol. 4, 2014, 8 pages.
Benck, J. et al., "Catalyzing the Hydrogen Evolution Reaction (HER) with Molybdenum Sulfide Nanomaterials," ACS Catalysis, vol. 4, 2014, pp. 3957-3971.
Benoist, L. et al., "X-ray photoelectron spectroscopy characterization of amorphous molybdenum oxysulfide thin films," Thin Solid Films, vol. 258, 1995, pp. 110-114.
Bourgeteau, T. et al., "A $H_2$-evolving photocathode based on direct sensitization of $MoS_3$ with an organic photovoltaic cell," Energy & Environmental Science, vol. 6, 2013, pp. 2706-2713.
Chen, Z. et al., "Core-shell $MoO_3$-$MoS_2$ Nanowires for Hydrogen Evolution: A Functional Design for Electrocatalytic Materials," Nano Letters, vol. 11, 2011, pp. 4168-4175.
Dameron, A. et al., "Pt—Ru Alloyed Fuel Cell Catalysts Sputtered from a Single Alloyed Target," ACS Catalysis, vol. 1, 2011, pp. 1307-1315.
Deutsch, T. et al., "Photoelectrochemical Characterization and Durability Analysis of GaInPN Epilayers," Journal of The Electrochemical Society, vol. 155, No. 9, 2008, pp. B903-B907.
Du, T. et al., "$TiO_2$-based solar cells sensitized by chemical-bath-deposited few-layer $MoS_2$," Journal of Power Sources, vol. 275, 2015, pp. 943-949.
Gu, J. et al., "Water reduction by a $p$-$GaInP_2$ photoelectrode stabilized by an amorphous $TiO_2$ coating and a molecular cobalt catalyst," Nature Materials, vol. 15, Apr. 2016, pp. 456-460.
Hou, Y. et al., "Bioinspired molecular co-catalysts bonded to a silicon photocathode for solar hydrogen evolution," Nature Materials, vol. 10, Jun. 2011, pp. 434-438.

Hu, X., "Universal and Versatile MoO3-Based Hole Transport Layers for Efficient and Stable Polymer Solar Cells," The Journal of Physical Chemistry C, vol. 118, 2014, pp. 9930-9938.
Jaramillo, T. et al., "Identification of Active Edge Sites for Electrochemical $H_2$ Evolution from $MoS_2$ Nanocatalysts," Science, vol. 317, Jul. 6, 2007, pp. 100-102.
Kanda, S. et al., "Facile synthesis and catalytic activity of $MoS_2$/$TiO_2$ by a photodeposition-based technique and its oxidized derivative $MoO_3$/$TiO_2$ with a unique photochromism," Journal of Colloid and Interface Science, vol. 354, 2011, pp. 607-610.
Khaselev, O. et al., "A Monolithic Photovoltaic-Photoelectrochemical Device for Hydrogen Production via Water Splitting," Science, vol. 280, Apr. 17, 1998, pp. 425-427.
Kibsgaard, J. et al., "Engineering the surface structure of $MoS_2$ to preferentially expose active edge sites for electrocatalysis," Nature Materials, vol. 11, Nov. 2012, pp. 963-969.
Kocha, S. et al., "Displacement of the Bandedges of $GaInP_2$ in Aqueous Electrolytes Induced by Surface Modification," Journal of the Electrochemical Society, vol. 142, No. 8, Aug. 1995, pp. 2625-2630.
Laursen, A. et al., "$MoS_2$—an integrated protective and active layer on $n+p$-Si for solar $H_2$ evolution," Physical Chemistry Chemical Physics, vol. 15, 2013, pp. 20000-20004.
Li, Y. et al., "$MoS_2$ Nanoparticles Grown on Graphene: An Advanced Catalyst for the Hydrogen Evolution Reaction," Journal of the American Chemical Society, vol. 133, 2011, pp. 7296-7299.
McKone, J. et al., "Hydrogen Evolution from Pt/Ru-Coated p-Type $WSe_2$ Photocathodes," Journal of the American Chemical Society, vol. 135, 2013, pp. 223-231.
Merki, D. et al., "Amorphous molybdenum sulfide films as catalysts for electrochemical hydrogen production in water," Chemical Science, vol. 2, 2011, pp. 1262-1267.
Mohamed, M. M., "Effect of ceria-doped titania on the structure and acidic properties of MoO3/TiO2 catalysts," Applied Catalysis A: General, vol. 267, 2004, pp. 135-142.
Morales-Guio, C. et al., "Hydrogen evolution from a copper (I) oxide photocathode coated with an amorphous molybdenum sulphide catalyst," Nature Communications, vol. 15, Jan. 2014, pp. 1-7.
Ponomarev, E.A. et al., "Electrochemical deposition of $MoS_2$ thin films by reduction of tetrathiomolybdate," Thin Solid Films, vol. 280, 1996, pp. 86-89.
Seah, M. P., "Post-1989 Calibration Energies for X-ray Photoelectron Spectrometers and the 1990 Josephson Constant," Surface and Interface Analysis, Letters to the Editor, vol. 14, 1989, p. 488.
Seger, B. et al., "Hydrogen Production Using a Molybdenum Sulfide Catalyst on a Titanium-Protected $n+p$-Silicon Photocathode," Angewandte Communications International Edition, vol. 51, 2012, pp. 9128-9131.
Seger, B. et al., "Using $TiO_2$ as a Conductive Protective Layer for Photocathodic $H_2$ Evolution," Journal of The American Chemical Society, vol. 135, 2013, pp. 1057-1064.
Song, S. et al., "Bandgap Widening of Phase Quilted, 2D $MoS_2$ by Oxidative Intercalation," Advanced Materials, vol. 27, 2015, pp. 3152-3158.
Tran, P. et al., "Novel Assembly of an $MoS_2$ Electrocatalyst onto a Silicon Nanowire Array Electrode to Construct a Photocathode Composed of Elements Abundant on the Earth for Hydrogen Generation," Chemistry A European Journal, vol. 18, 2012, pp. 13994-13999.
Tsang, S. et al., "Magnetically Separable, Carbon-Supported Nanocatalysts for the Manufacture of Fine Chemicals," Angewandte Chemie, vol. 116, 2004, pp. 5763-5767.
Vrubel, H. et al., "Growth and Activation of an Amorphous Molybdenum Sulfide Hydrogen Evolving Catalyst," ACS Catalysis, vol. 3, 2013, pp. 2002-2011.
Wang, H. et al., "Direct Water Splitting under Visible Light with Nanostructured Hematite and $WO_3$ Photoanodes and a $GaInP_2$ Photocathode," Journal of the Electrochemical Society, vol. 155, No. 5, 2008, pp. F91-F96.
Zhang, L. et al., "$MoS_2$-wrapped silicon nanowires for photoelectrochemical water reduction," Nano Research, vol. 8, No. 1, 2015, pp. 281-287.

(56) References Cited

OTHER PUBLICATIONS

Zhou, J. et al., "Efficient and stable $MoS_2$ catalyst integrated on Si photocathodes by photoreduction and post-annealing for water splitting," Applied Physics Letters, vol. 108, 2016, pp. 213905-1 thru 213905-5.

Zhou, X. et al., "Thin $MoS_2$ on $TiO_2$ nanotube layers: An efficient co-catalyst/harvesting system for photocatalytic $H_2$ evolution," Electrochemistry Communications, vol. 73, 2016, pp. 33-37.

\* cited by examiner

GRADED CATALYTIC-PROTECTIVE LAYER FOR AN EFFICIENT AND STABLE WATER-SPLITTING PHOTOCATHODE

CROSS-REFERENCE TO RELATED APPLICATIONS

This application claims the benefit of U.S. Provisional Application No. 62/444,215 filed Jan. 9, 2017, the contents of which are incorporated herein by reference in their entirety.

CONTRACTUAL ORIGIN

The United States Government has rights in this disclosure under Contract No. DE-AC36-08GO028308 between the United States Department of Energy and the Alliance for Sustainable Energy, LLC, the Manager and Operator of the National Renewable Energy Laboratory.

BACKGROUND

Achieving solar-to-hydrogen efficiencies above 15% is important for the commercial success of photoelectrochemical water splitting devices. While tandem cells can reach those efficiencies, increasing the catalytic activity and long-term stability remains a significant challenge. Hydrogen, utilized in fuel cells to power electric motors or burned in internal combustion engines, is an environmentally friendly energy carrier with the potential to reduce our dependence on fossil fuels. However, the production of hydrogen by the traditional gasification of coal and oil and by steam-methane reforming produces large amounts of carbon dioxide, which has implications for climate change. An alternative long-term, sustainable pathway to hydrogen production is a photoelectrochemical (PEC) cell that absorbs sunlight and converts this energy into hydrogen and oxygen via the dissociation of water molecules. Oxide semiconductor materials, such as $Fe_2O_3$, $WO_3$, $SrTiO_3$ and $TiO_2$, have been studied for many years for PEC water splitting. However, the slow charge transport kinetics and/or large band gaps that typically define these oxide semiconductors result in very low energy conversion efficiencies. In addition, many materials typically used in PEC cells are susceptible to corrosion during the water splitting process. To realize and commercialize future solar hydrogen concepts based on PEC devices, durability of tens of thousands of hours and a device cost of hundreds of dollars per square meter must be achieved. Thus, it is important to explore possible surface stabilization and catalytic approaches that may improve PEC cell performances, stabilities, and life-spans.

SUMMARY

An aspect of the present disclosure is a composition that includes, in order: a first layer that includes $MA_w$; a second layer that includes $MO_yA_z$; and a third layer that includes $MO_x$, where M includes a transition metal, A includes at least one of sulfur, selenium, and/or tellurium, w is between greater than zero and less than or equal to five, x is between greater than zero and less than or equal to five, y is between greater than zero and less than or equal to five, and z is between greater than zero and less than or equal to five. In some embodiments of the present disclosure, the transition metal may include at least one of molybdenum and/or tungsten. In some embodiments of the present disclosure, A may be sulfur.

In some embodiments of the present disclosure, the first layer may include $MoS_w$. In some embodiments of the present disclosure, the second layer may include $MoO_yS_z$. In some embodiments of the present disclosure, the third layer may include $MoO_x$. In some embodiments of the present disclosure, w may be between greater than one and less than or equal to three. In some embodiments of the present disclosure, the composition may further include a first transition layer positioned between the first layer and the second layer, where the transition layer may contain intermixed $MA_w$ and $MO_yA_z$. In some embodiments of the present disclosure, the composition may further include a first transition layer positioned between the second layer and the third layer, where the transition layer may contain intermixed $MO_yA_z$ and $MO_x$. In some embodiments of the present disclosure, the first layer, the second layer, and the third layer may all be at least partially intermixed.

In some embodiments of the present disclosure, at least one of the first layer, the second layer, and/or the third layer may be at least partially crystalline. In some embodiments of the present disclosure, the first layer may have a thickness between 1 μm and 100 μm. In some embodiments of the present disclosure, the second layer may have a thickness between 1 μm and 100 μm. In some embodiments of the present disclosure, the third layer may have a thickness between 1 μm and 100 μm. In some embodiments of the present disclosure, the composition may further include an oxide layer, where the third layer may be positioned between the oxide layer and the second layer. In some embodiments of the present disclosure, the oxide layer may include at least one of titanium oxide, aluminum oxide, and/or zinc oxide. In some embodiments of the present disclosure, the composition may further include an active layer that includes a group III-V alloy, where the oxide layer may be positioned between the active layer and third layer.

An aspect of the present disclosure is a method that includes, in order: depositing a starting layer that includes $MA_v$ onto an oxide layer; and annealing the starting layer and the oxide layer, where v is between greater than zero and less than or equal to five, and the annealing transforms the starting layer to a graded layer that includes, in order: a first layer that includes $MA_w$; a second layer that includes $MO_yA_z$; and a third layer that includes $MO_x$, where wherein M includes a transition metal, A includes at least one of sulfur, selenium, and/or tellurium, w is between greater than zero and less than or equal to five, x is between greater than zero and less than or equal to five, y is between greater than zero and less than or equal to five, and z is between greater than zero and less than or equal to five. In some embodiments of the present disclosure, the depositing may be performed by electrochemical cathodic deposition.

An aspect of the present disclosure is a method for photoelectrochemical water-splitting, where the method includes contacting a device with water and exposing the device to a light source, where the contacting and the exposing convert at least a portion of the water to hydrogen, and the device includes a first layer that includes $MA_w$, a second layer that includes $MO_yA_z$, and a third layer that includes $MO_x$, where M includes a transition metal, A includes at least one of sulfur, selenium, and/or tellurium, w is between greater than zero and less than or equal to five, x is between greater than zero and less than or equal to five, y is between greater than zero and less than or equal to five, and z is between greater than zero and less than or equal to five.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 3A illustrates photocurrent density-potential (J-V) curves (scan rate is 20 mV·s$^{-1}$) in 0.5 M $H_2SO_4$ under 1 sun illumination. FIG. 3B illustrates incident photon-to-current conversion efficiency (IPCE) of various $GaInP_2$ electrodes in 0.5 M $H_2SO_4$ at 0 V vs. reversible hydrogen electrode (RHE). FIG. 3C illustrates 10 min photocurrent density-time (J-t) plots of different $GaInP_2$ electrodes held at 0 V vs. RHE in 0.5 M $H_2SO_4$ under 1 sun illumination. FIG. 3D illustrates 20-hour photocurrent density-time (J-t) plots of different $GaInP_2$ electrodes held at 0 V vs. RHE in 0.5 M $H_2SO_4$ under 1 sun illumination.

| REFERENCE NUMBERS | |
|---|---|
| 100 | device |
| 110 | graded layer |
| 120 | active layer |
| 130 | oxide layer |
| 140 | MoO$_x$ layer |
| 150 | MoO$_y$S$_z$ layer |
| 160 | MoS$_w$ layer |
| 170 | transition layer |
| 200 | method |
| 210 | grow GaInP$_2$ |
| 220 | deposit TiO$_x$ |
| 230 | deposit MoS$_w$ |
| 240 | anneal |

DETAILED DESCRIPTION

The present disclosure may address one or more of the problems and deficiencies of the prior art discussed above.

However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to a method that may include annealing a bilayer of amorphous titanium oxide ($TiO_x$) and molybdenum sulfide ($MoS_w$) deposited onto $GaInP_2$ to form a photocathode with high catalytic activity (current density of 11 mA/cm$^2$ at 0 V vs. the reversible hydrogen electrode under 1 sun illumination) and stability (retention of 80% of initial photocurrent density over a 20-hour durability test) for the hydrogen evolution reaction. Microscopy and spectroscopy reveal that annealing results in a graded $MoS_w/MoO_x/TiO_2$ layer that retains much of the high catalytic activity of amorphous $MoS_w$ but with stability similar to crystalline $MoS_2$. These findings demonstrate the potential of utilizing a hybridized, heterogeneous surface layer as a cost-effective catalytic and protective interface for solar hydrogen production. Thus, annealing a bilayer of a-$MoS_w/TiO_x$, applied to a $GaInP_2$ photoelectrode, is shown herein to result in a graded g-$MoS_w/MoO_yS_z/MoO_x/c$-$TiO_2$ interfacial layer, resulting in a photocathode with PEC properties superior to that of a $GaInP_2$ electrode coupled with a PtRu alloy hydrogen evolution reaction (HER) catalyst.

Figure 1A:
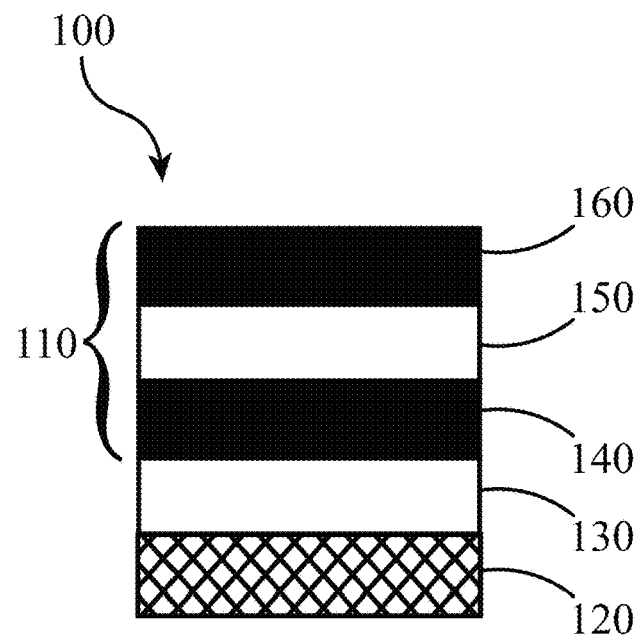
FIGS. 1A and 1B illustrate a device, according to some embodiments of the present disclosure.
Figure 1B:
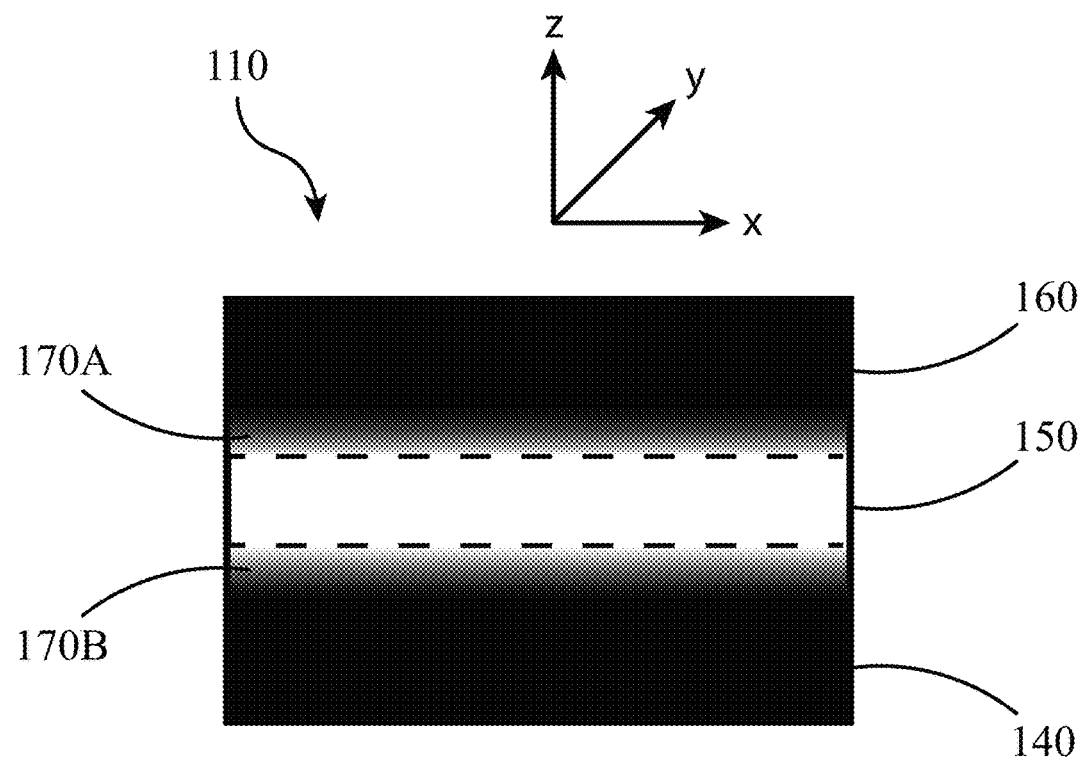

FIG. 1A illustrates a device 100 that includes a graded layer 110 positioned on an oxide layer 130. The graded layer 110 includes an $MoS_w$ layer 160 and a $MoO_x$ layer 140, with a $MoO_yS_z$ layer 150 positioned between the $MoS_w$ layer 160 and the $MoO_x$ layer 140. The oxide layer 130 is positioned between the graded layer 110 and an active layer 120. FIG. 1A illustrates that in some embodiments of the present disclosure, the constituent layers of the graded layer 110 (e.g. the $MoO_x$ layer 140, the $MoO_yS_z$ layer 150, or the $MoS_w$ layer 160) may have distinct interfacial boundaries. FIG. 1B illustrates that in some embodiments of the present disclosure, the boundaries between the constituent layers of the graded layer 110 (e.g. the $MoO_x$ layer 140, the $MoO_yS_z$ layer 150, or the $MoS_w$ layer 160) may transition from a first bulk composition for a first layer, through a composition that varies with thickness (e.g. in the z-axis direction), to a bulk second composition for one of its neighboring layers. So, referring again to FIG. 1B, in some embodiments of the present disclosure, the $MoS_w$ layer 160 may transition from its bulk composition, through a transition layer 170A, to a bulk composition for the $MoO_yS_z$ layer 150, where the transition layer 170A has a variable composition relative to the z-axis (thickness) of the transition layer 170A that approaches the bulk composition of the $MoS_w$ layer 160 near the $MoS_w$ layer 160, and approaches the bulk composition of the $MoO_yS_z$ layer 150 near the $MoO_yS_z$ layer 150. For the intermediate compositions between these two extremes, the composition of the transition layer 170A may vary in a linear and/or nonlinear fashion. Similarly, in some embodiments of the present disclosure, the $MoO_yS_z$ layer 150 may transition from its bulk composition, through a transition layer 170B, to a bulk composition for the $MoO_x$ layer 140, where the transition layer 170B has a variable composition relative to the z-axis (thickness) of the transition layer 170B that approaches the bulk composition of the $MoO_yS_z$ layer 150 near the $MoO_yS_z$ layer 150, and approaches the bulk composition of the $MoO_x$ layer 140 near the $MoO_x$ layer 140. For the intermediate compositions between these two extremes, the composition of the transition layer 170B may vary in a linear or nonlinear fashion. So, in some embodiments of the present disclosure, the compositions making up the individual layers may be substantially intermixed, such that the boundaries between the individual layers are diffuse and not precisely defined. Thus, as used herein, the term "graded layer" refers to a layer constructed of two or more layers with unique compositions and having at least one distinct interfacial boundary between neighboring layers (see FIG. 1A) and/or at least one transition layer 170 between neighboring layers (see FIG. 1B) and/or having diffuse, non-distinct boundaries separating the neighboring layers.

Referring again to FIGS. 1A and 1B, these illustrate a graded layer 110 that includes an $MoS_w$ layer 160 and a $MoO_x$ layer 140, with a $MoO_yS_z$ layer 150 positioned between the $MoS_w$ layer 160 and the $MoO_x$ layer 140. However, in general, the principles described herein may be applied using other transition metals in place of molybdenum, and selenium and/or tellurium in place of sulfur. Transition metals could include those from groups 3, 4, 5, 6, 7, 8, 9, 10, 11, and 12 in the 3$^{rd}$, 4$^{th}$, or 5$^{th}$ rows. Examples of transition metals include scandium, titanium, vanadium, tungsten, chromium, manganese, iron, cobalt, nickel, copper, and zinc. Thus, in some embodiments of the present disclosure, a graded layer 110 may include a $MA_w$ layer 160 and a $MO_x$ layer 140, with a $MO_yA_z$ layer 150 positioned between the $MA_w$ layer 160 and the $MO_x$ layer 140, where "M" is at least one transition metal and "A" is at least one of sulfur, selenium, and/or tellurium. Such layers may be achieved using the methods described herein for the example utilizing molybdenum sulfide.

In some embodiments of the present disclosure, the oxide layer 130 may be constructed of at least one of titanium oxide ($TiO_2$), aluminum oxide ($Al_2O_3$), and/or zinc oxide (ZnO). In some embodiments of the present disclosure, the active layer 120 may include a Group III-V alloy, for example an alloy that includes at least two of aluminum, gallium, indium, boron, thallium, nitrogen, phosphorus, arsenic, antimony, and/or bismuth. In some embodiments of the present disclosure, the active layer 120 may include at least one of GaN, GaP, GaAs, InP, InAs, AlGaAs, InGaAs, AlInAs, AlInSb, GaAsN, GaAsP, AlGaN, AlGaP, InGaN, and/or InAsSb. These alloys may be present in any reasonable stoichiometric ratios. For example, for the case where the active layer 120 is constructed of GaInP, the active layer 120 may be of any suitable stoichiometric concentration of the gallium and indium; for example, GaInP refers to concentrations $Ga_xIn_{1-x}P$, where x may be any value between zero and 1 inclusively. In some embodiments of the present disclosure, any one of the layers may have a thickness between 1 μm and 1000 μm; e.g. the active layer 120, the oxide layer 130, the $MoO_x$ layer 140, the $MoO_yS_z$ layer 150, the $MoS_w$ layer 160, and/or the transition layers 170.

Figure 2:
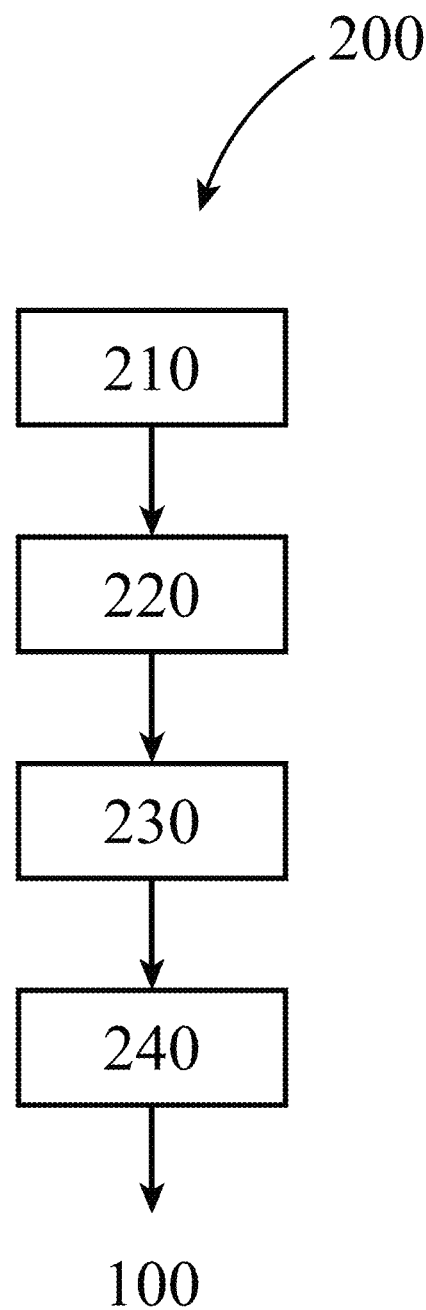
FIG. 2 illustrates a method for making a device, according to some embodiments of the present disclosure.

FIG. 2 illustrates a method 200 for manufacturing a device 100 similar to that shown in FIGS. 1A and 1B, where the method 200 may begin by growing 210 an active layer, followed by depositing 220 an oxide layer on the active layer, depositing 230 a $MoS_w$ layer on the $TiO_x$ layer, and finally, annealing 240 the active layer, oxide layer, and $MoS_w$ layer. Any of the layers deposited by method 200 may be completed by one or more suitable vapor phase deposition techniques with examples including but not limited to chemical vapor deposition (e.g. atomic layer deposition, physical vapor deposition, sputtering, electron/ion beam evaporation, and/or laser ablation. Suitable solution methods may also be applied, including sol-gel methods.

Surface Modification of GaInP:

p-$GaInP_2$ wafers were grown at NREL using metal-organic vapor phase epitaxy as described below. Amorphous titanium dioxide (a-TiO$_x$) layers were deposited by atomic layer deposition (ALD) onto bare p-GaInP$_2$ electrodes to create a-TiO$_x$—GaInP$_2$ samples. Amorphous MoS$_w$, where w may range 1<w≤3 was deposited onto a fresh a-TiO$_x$—GaInP$_2$ sample using electrochemical cathodic deposition, as described below to form a-MoS$_w$/a-TiO$_x$—GaInP$_2$, which was annealed at high temperature (450° C.) to give g-MoS$_w$/MoO$_x$/c-TiO$_2$—GaInP$_2$. For brevity, we refer to g-MoS$_w$/MoO$_x$/c-TiO$_2$—GaInP$_2$ as g-MoS$_w$/c-TiO$_2$—GaInP$_2$ for the rest of the ensuing text. However, as used herein, "a-MoS$_w$" refers to a single, amorphous layer of molybdenum sulfide. As used herein, the term "g-MoS$_w$" refers to a graded layer as shown in FIGS. 1A and 1B (see reference numeral 110). Thus, a g-MoS$_w$ layer is a graded layer 110 containing its constituent layers of each of a MoO$_x$ layer 140, a MoO$_y$S$_z$ layer 150, and a MoS$_w$ layer 160, with either defined interfacial boundaries and/or boundaries having transition layers 170. For benchmarking, a PtRu catalyst was deposited onto bare GaInP$_2$ via sputtering to yield PtRu—GaInP$_2$. The HER catalytic activities of these electrodes were measured by linear sweep voltammetry scanning in the cathodic direction in Ar-purged 0.5 M H$_2$SO$_4$ solutions (pH 0.3) under 1 sun conditions (for all electrochemical experiments). All electrodes under dark condition show no measurable HER activity in the potential window. In general, as used herein the prefixes "g" refers to "graded", "a" refers to "amorphous", "c" refers to "crystalline", and "p" refers to a p-type/doped semiconductor material.

Figure 3A:
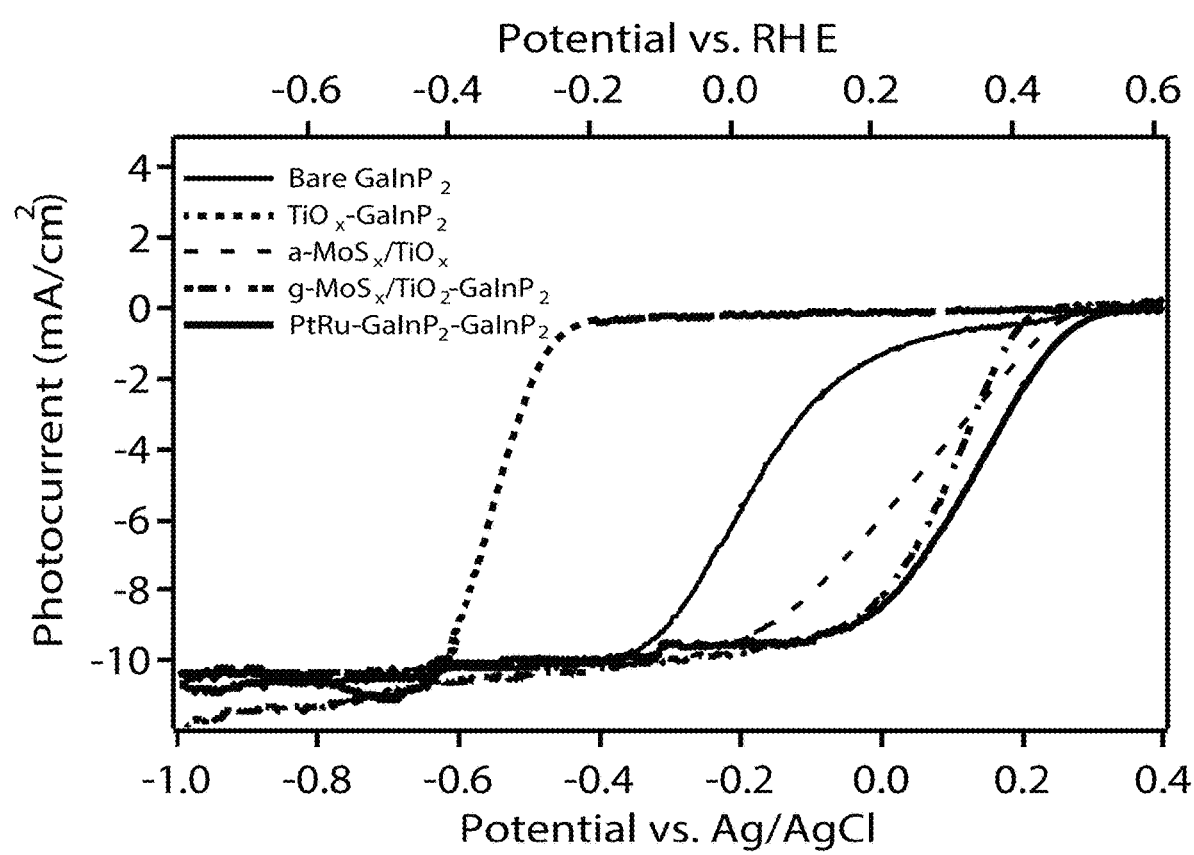
FIGS. 3A, 3B, 3C, and 3D illustrate photoelectrochemical measurements of $GaInP_2$-based photocathodes for hydrogen evolution, according to some embodiments of the present disclosure.
Figure 3B:
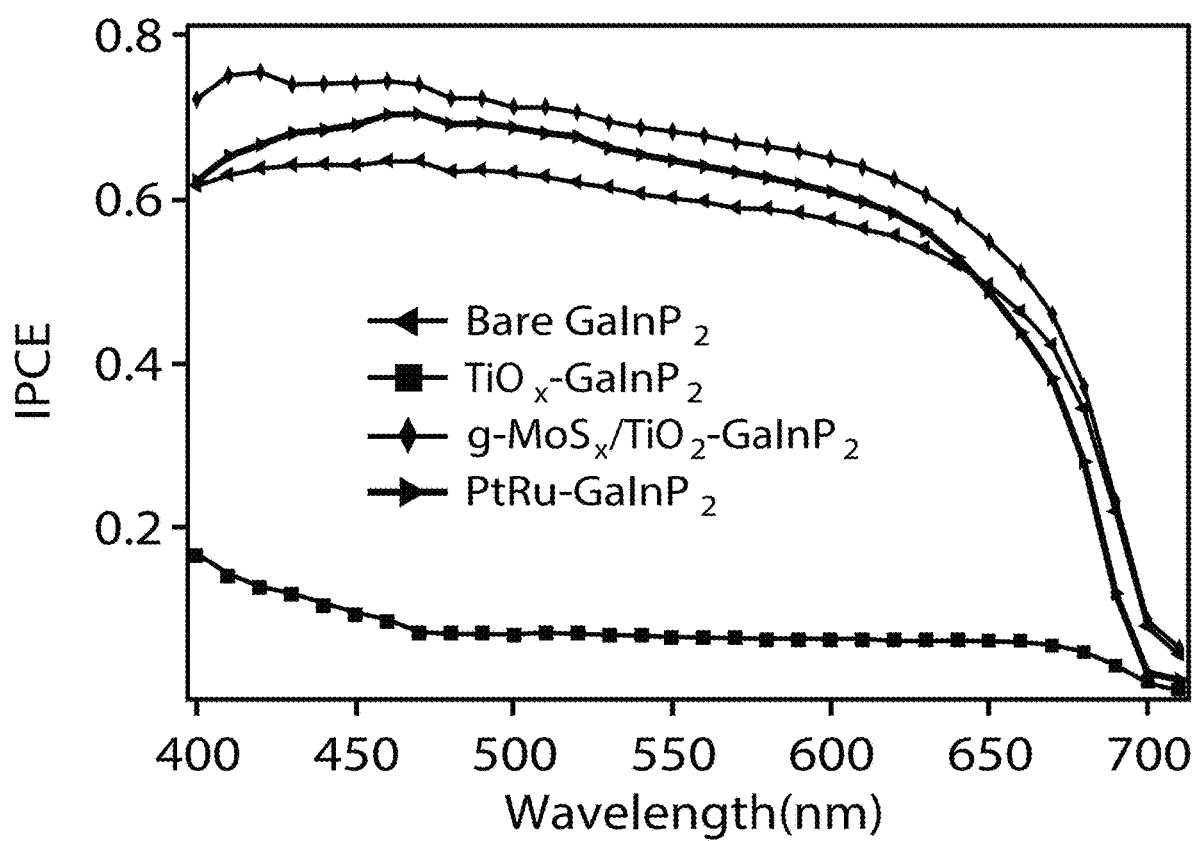

Photoelectrochemical Profile:

Representative photocurrent density-potential (J-V) plots are shown in FIG. 3A for bare GaInP$_2$, TiO$_x$—GaInP$_2$ (where x for titanium oxide may very between 1 and 2 inclusively), a-MoS$_w$/a-TiO$_x$—GaInP$_2$, g-MoS$_w$/c-TiO$_2$—GaInP$_2$ and PtRu—GaInP$_2$ electrodes. As can be seen from these data, the a-TiO$_x$—GaInP$_2$ electrode reached a saturated photocurrent density (~10 mA·cm$^{-2}$) at ca. 500 mV overpotential vs. the reversible hydrogen electrode (RHE) (cf. ca. 150 mV for bare GaInP$_2$) consistent with the well-known poor HER activity of a-TiO$_x$. Adding a layer of a-MoS$_w$ caused the onset potential to shift positively and the saturated photocurrent density to be reached at near zero overpotential, albeit with a low fill factor. Converting the a-MoS$_w$/a-TiO$_x$—GaInP$_2$ to g-MoS$_w$/c-TiO$_2$—GaInP$_2$ via annealing resulted in a substantially improved fill factor, likely due to improved electron transport through the now mostly graded layer (g-MoS$_w$). However the onset potential decreased slightly, presumably owing to the greater number of active sites in the a-MoS$_w$ layer in the unannealed sample. A PtRu catalyst decorated electrode (PtRu—GaInP$_2$), which is known to exhibit HER catalytic activity superior to Pt or Ru alone, is employed here as a benchmark system. As can be seen from FIG. 3A, the catalytic activity of the annealed g-MoS$_w$/c-TiO$_2$—GaInP$_2$ sample is comparable to PtRu—GaInP$_2$, as evidenced by similar 0.2 V underpotentials at the saturated photocurrent density, albeit with a 100 mV more positive onset potential. This result is consistent with the onset potential difference of 145 mV between Pt and MoS$_w$ catalysts on a Ti-n+p-Si photoelectrode. Finally, the photocurrent density values were consistent with IPCE measurements (see FIG. 3B) which displayed a high conversion efficiency (up to 75% across the visible range) from the annealed MoS$_2$/TiO$_2$—GaInP$_2$ electrode, ~10% higher than PtRu modified electrode, and ~20% higher than the bare GaInP$_2$. So, as describe herein, annealing a-MoS$_w$/a-TiO$_x$—GaInP$_2$ results in g-MoS$_w$/c-TiO$_2$—GaInP$_2$ where in some embodiments the g-MoS$_w$ (the graded layer) may be crystalline, amorphous, or a combination thereof.

Figure 3C:
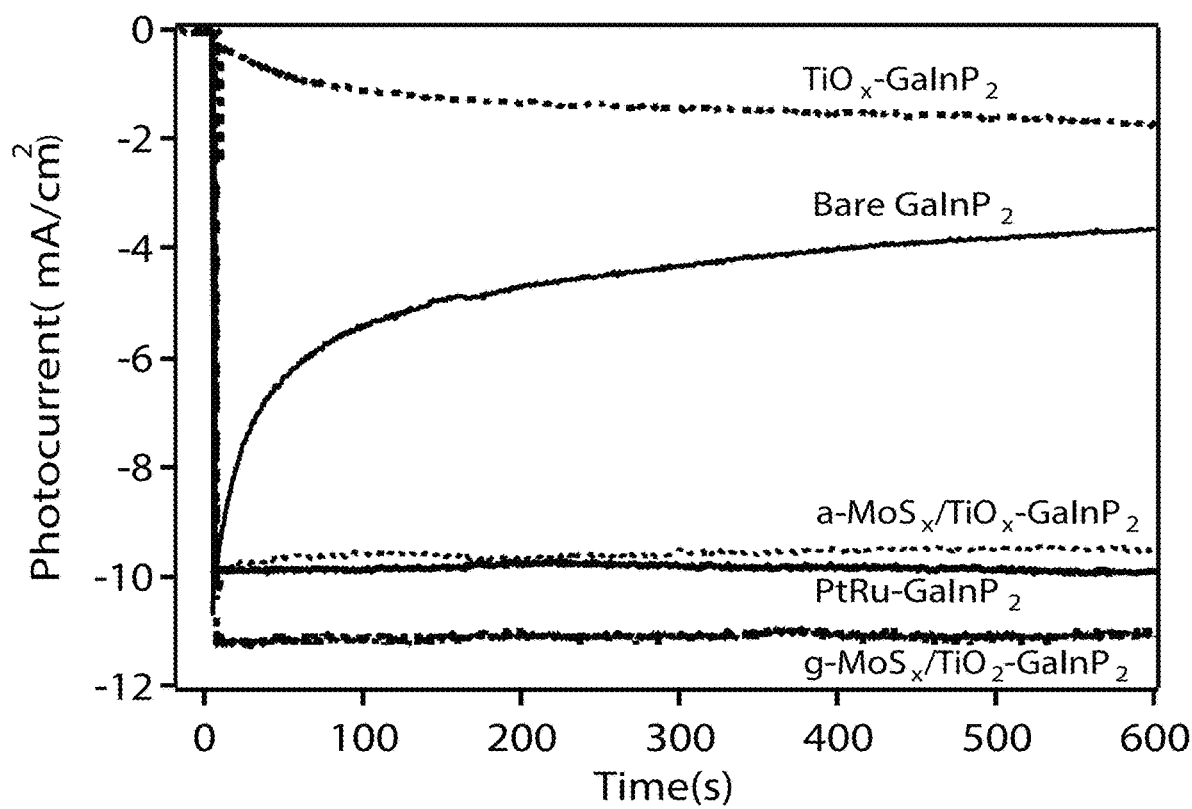

Material Stability and Hydrogen Production:

Photocurrent density versus time was monitored at 0 V vs. RHE to evaluate the short-term (10 min) durability of the electrodes. The cathodic current density of bare GaInP$_2$ exhibited rapid decay owing to photocorrosion as is well known. The a-TiO$_x$—GaInP$_2$ sample showed an apparent increase in photocurrent density to 1-2 mA/cm$^2$ over this time frame, but this is likely also attributed to photocorrosion due to the limited thermodynamic stability of TiO$_x$ in acidic media. In contrast, all samples with catalytically active layers (a-MoS$_w$/a-TiO$_x$—GaInP$_2$, g-MoS$_w$/c-TiO$_2$—GaInP$_2$ and PtRu—GaInP$_2$) exhibited little photocurrent decay during the 10 min photoelectrolysis experiment (see FIG. 3C). The initial charging spike from the a-MoS$_w$/a-TiO$_x$—GaInP$_2$ sample may be due to the capacitance change and may not reflect the real current.

Figure 3D:
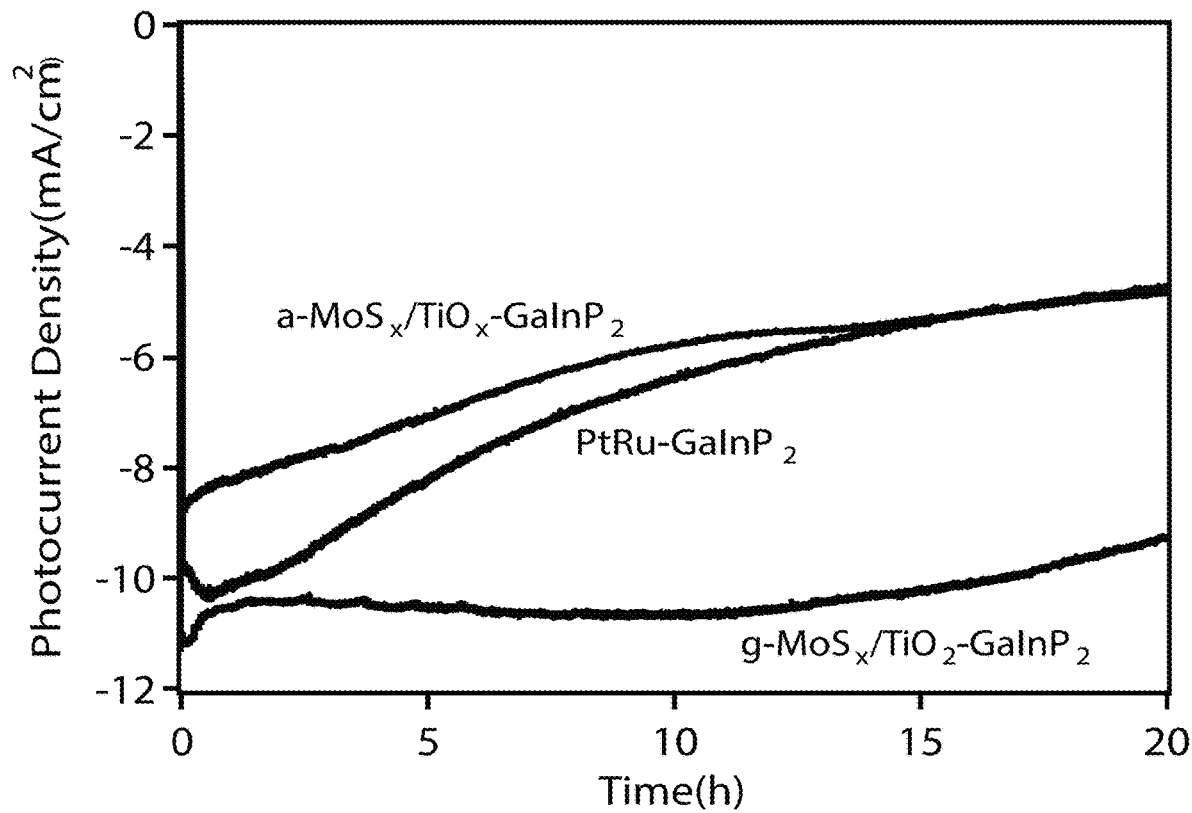
Figure 4A:
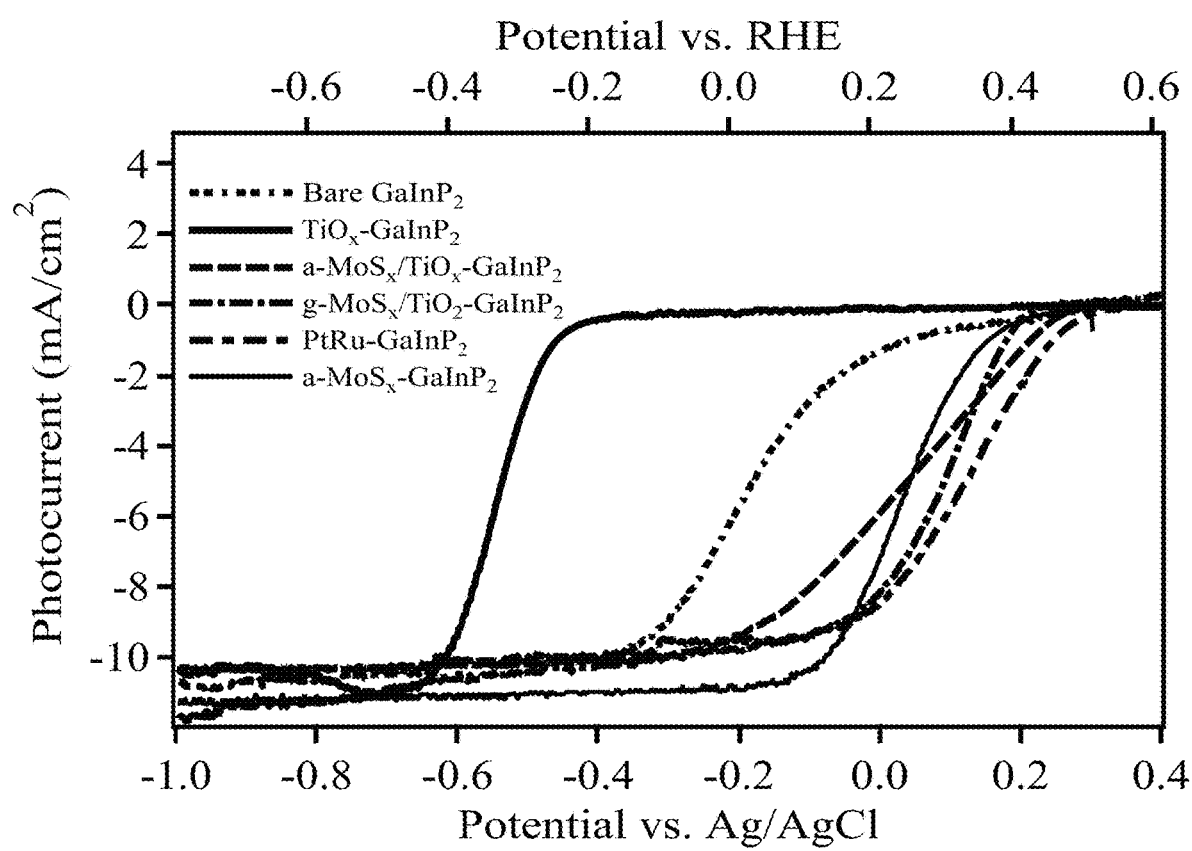
FIG. 4A illustrates photocurrent density-potential plots of unannealed a-MoS$_w$—$GaInP_2$ compared with other electrodes, according to some embodiments of the present disclosure.
Figure 4B:
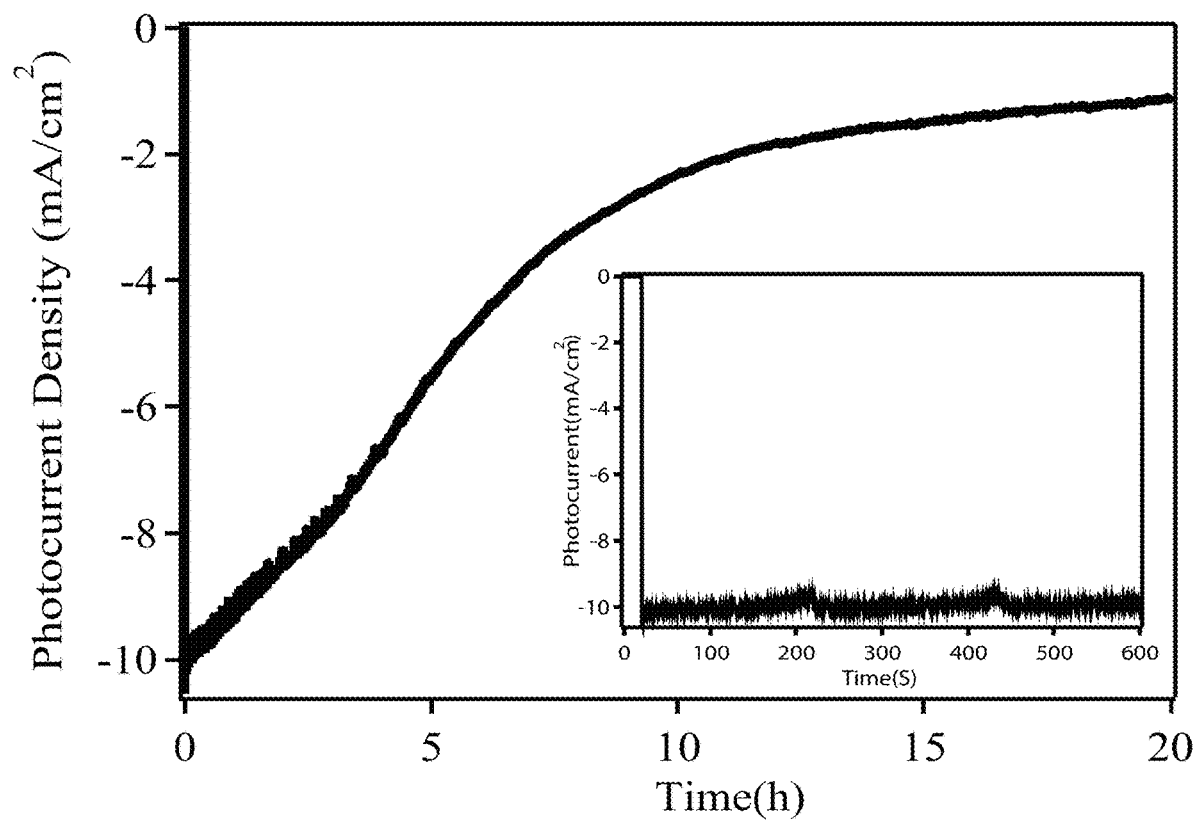
FIG. 4B illustrates 20-hour photocathode stability of unannealed a-MoS$_w$—$GaInP_2$ at 0 V vs. RHE (inset is 10 min electrolysis at 0V vs. RHE), according to some embodiments of the present disclosure.
Figure 4C:
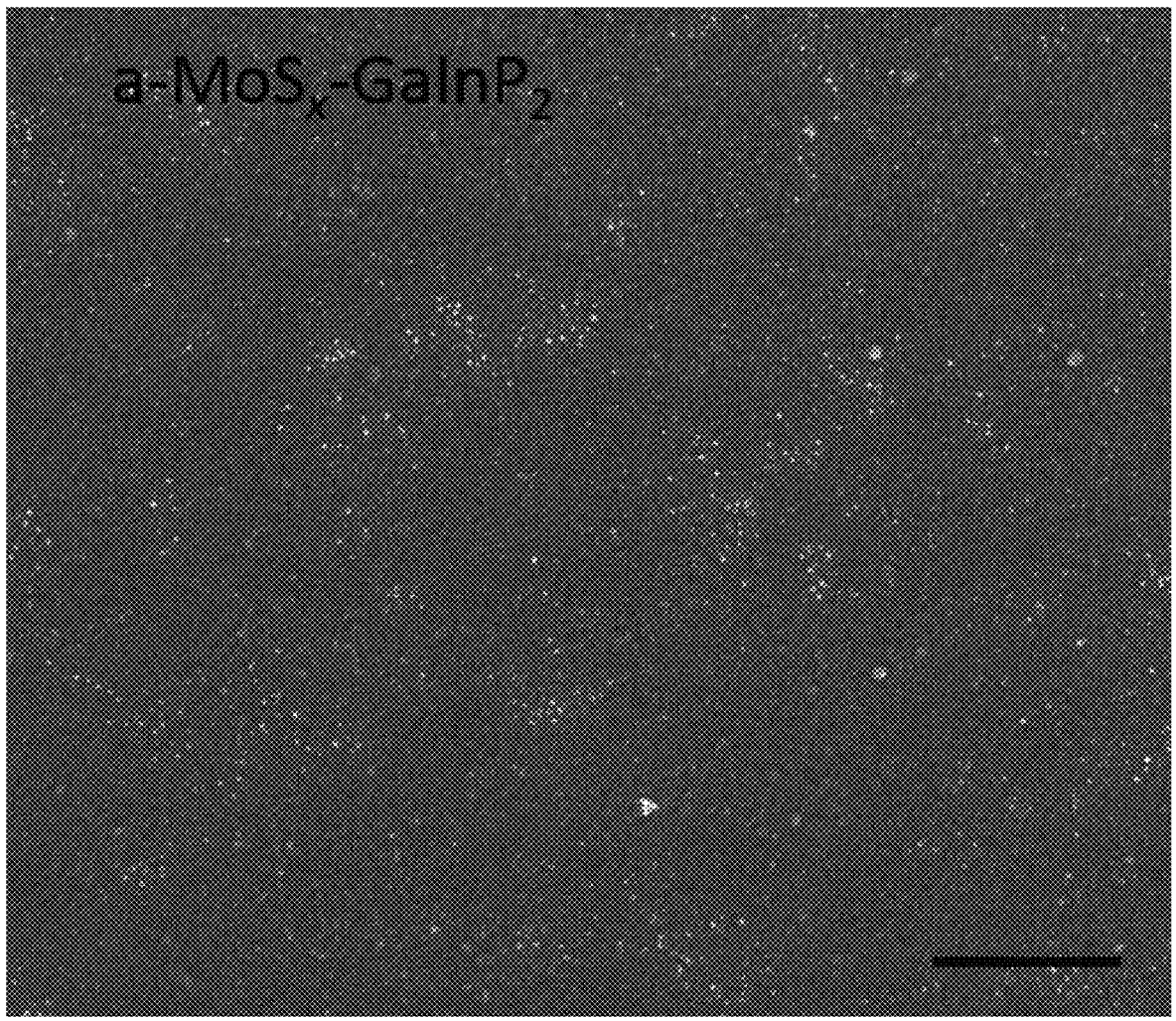
FIG. 4C illustrates an SEM image of a-MoS$_w$—$GaInP_2$, according to some embodiments of the present disclosure.
Figure 5A:
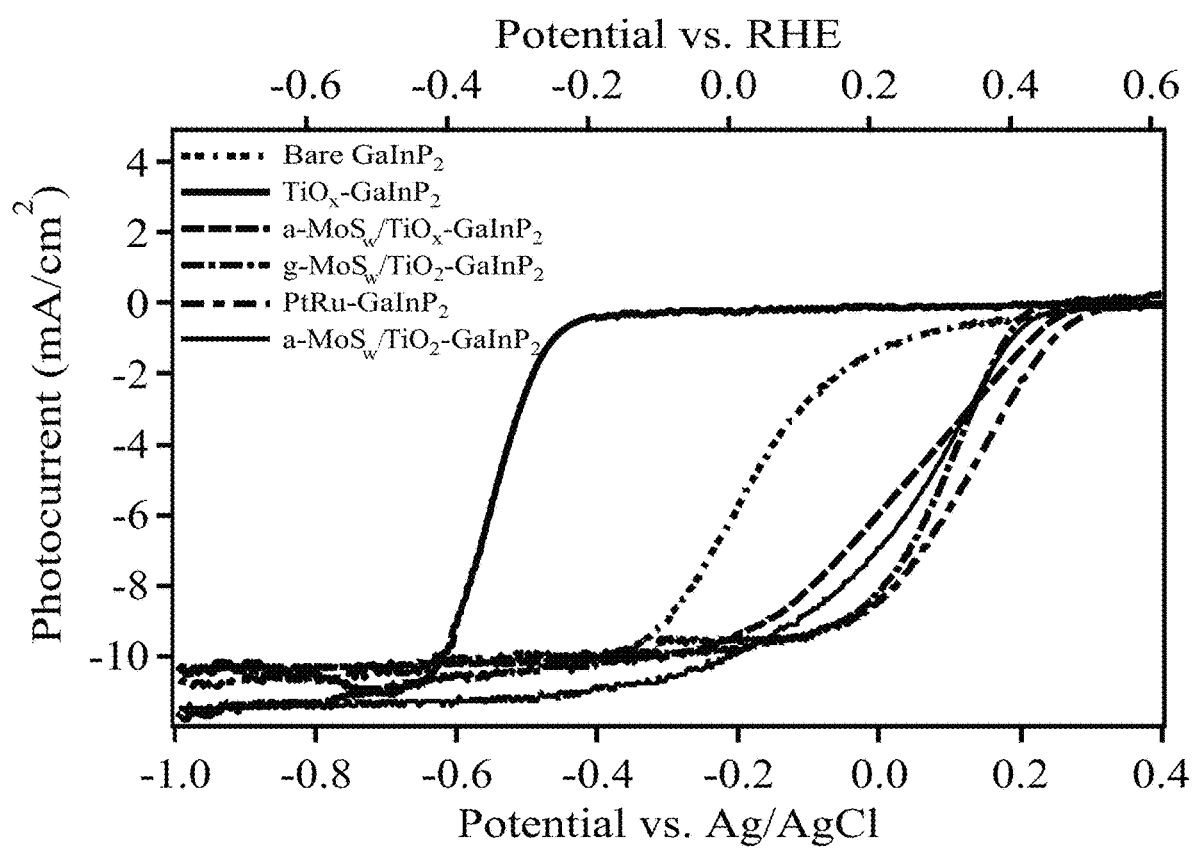
FIG. 5A illustrates photocurrent density-potential plots of a-MoS$_w$/$TiO_2$—$GaInP_2$ compared with other electrodes, according to some embodiments of the present disclosure.
Figure 5B:
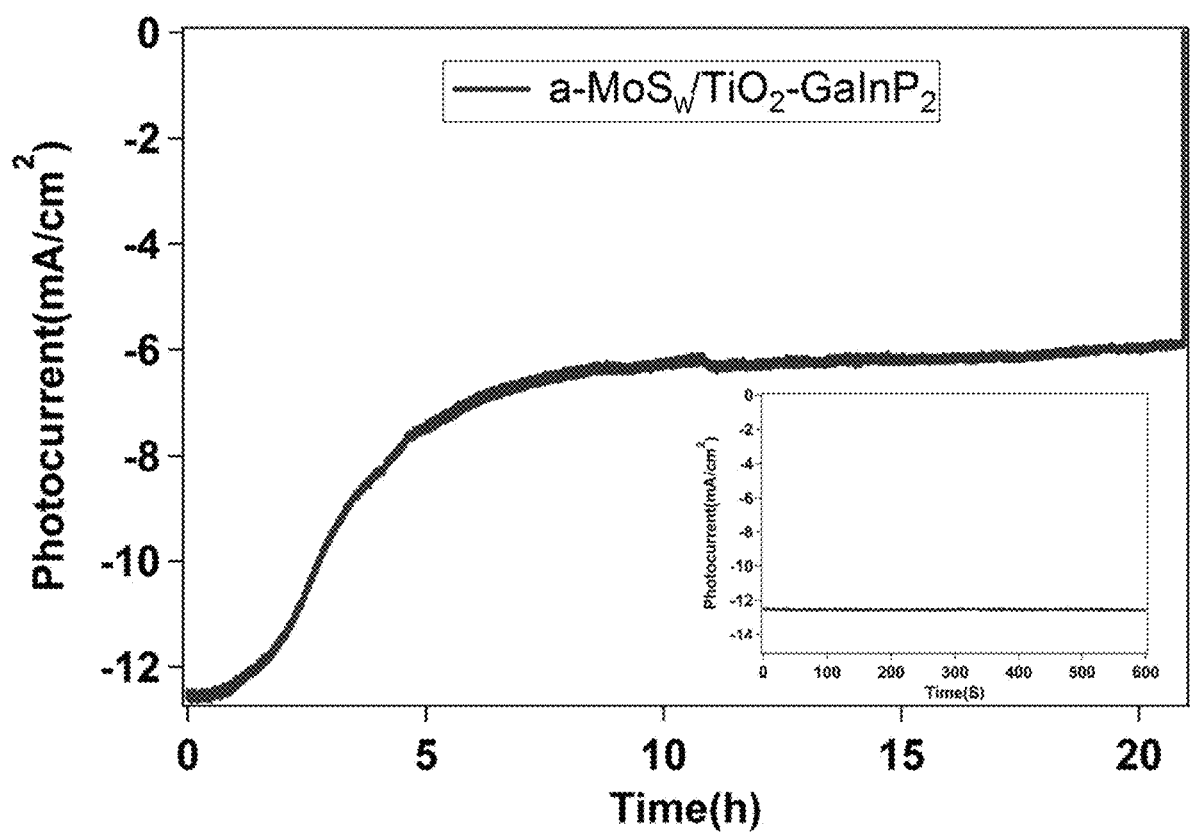
FIG. 5B illustrates 20-hour photocathode stability of a-MoS$_w$/$TiO_2$—$GaInP_2$ at 0 V vs. RHE (inset is 10 min electrolysis at 0V vs. RHE), according to some embodiments of the present disclosure.
Figure 6:
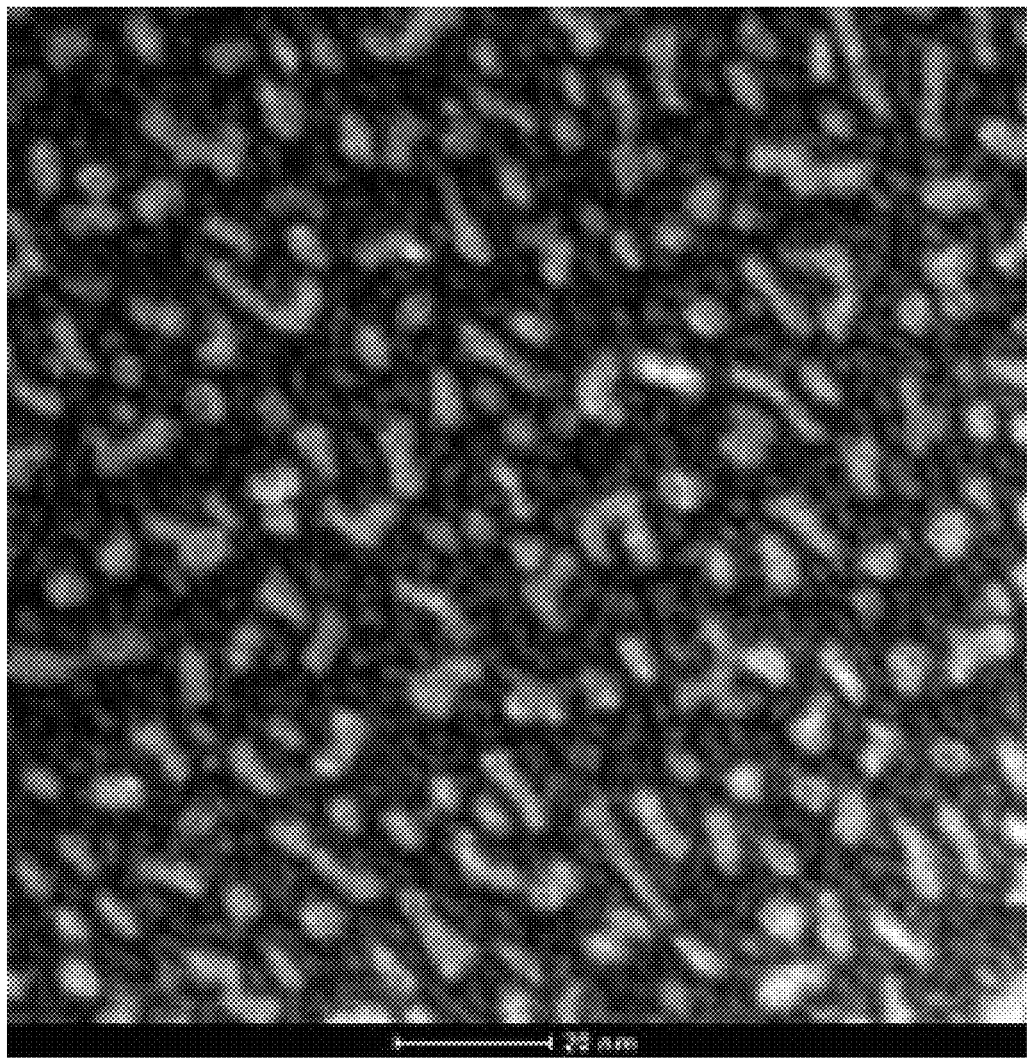
FIG. 6 illustrates a STEM HAADF image of PtRu—$GaInP_2$ electrode, according to some embodiments of the present disclosure. Bright contrast regions are PtRu nanoparticles on the $GaInP_2$ surface. Under these imaging conditions, areas that have a higher average atomic number appear brighter.
Figure 7:
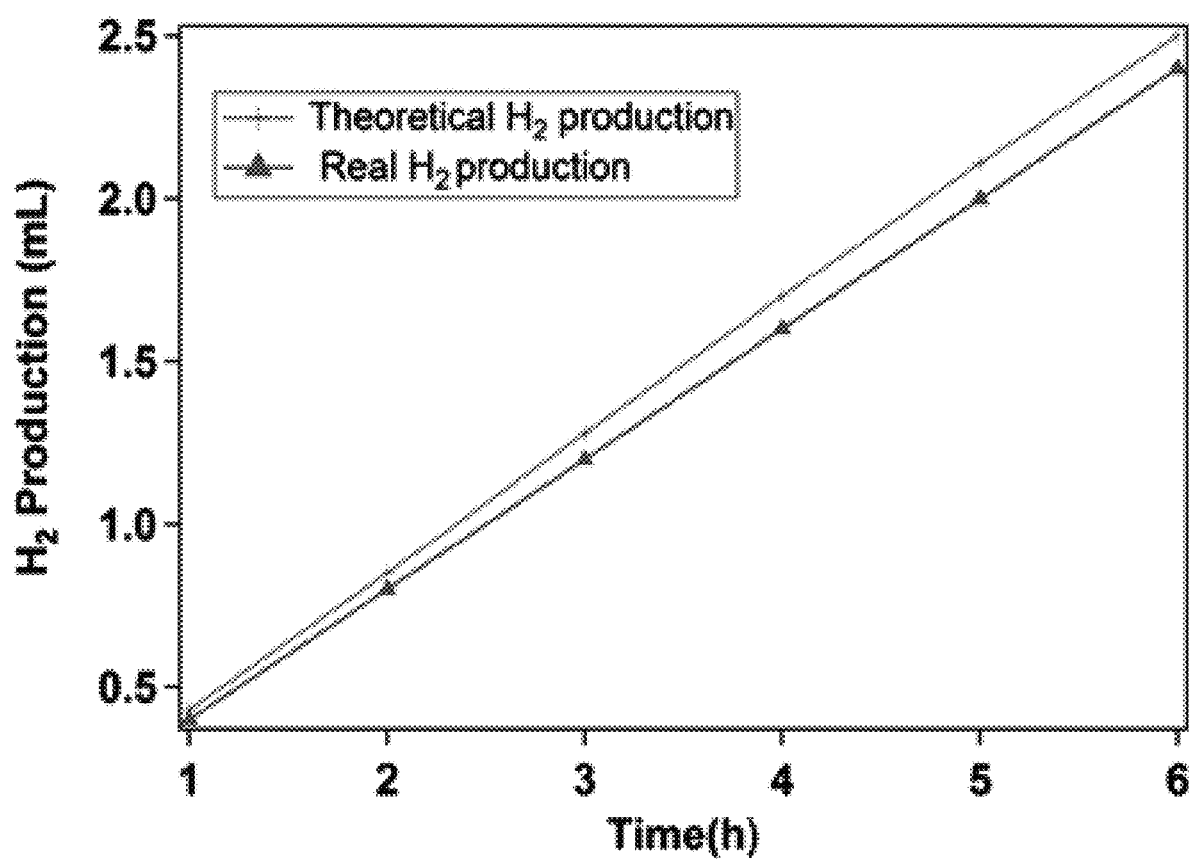
FIG. 7 illustrates calculated vs. experimental hydrogen production of g-MoS$_w$/$TiO_2$—$GaInP_2$ electrode under 1 sun illumination for the first 6 hours of electrolysis, according to some embodiments of the present disclosure. The experiment was conducted in 0.5 M $H_2SO_4$ under 1 sun illumination intensity at 0 V vs. RHE.
Figure 8:
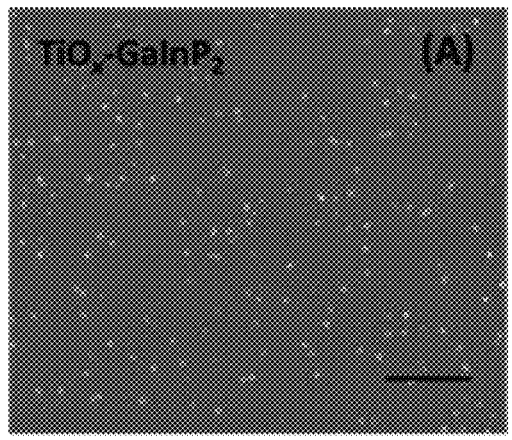
FIG. 8 illustrates SEM images: (Panel A) $TiO_x$—$GaInP_2$; (Panel B) a-MoS$_w$/$TiO_x$—$GaInP_2$; (Panel C) g-MoS$_w$/$TiO_2$—$GaInP_2$; and (Panel D) $MoS_2$/$TiO_2$—$GaInP_2$ after 20 h photoelectrolysis at 0 V vs. RHE (scale bar: 1 μm), according to some embodiments of the present disclosure.
Figure 8:
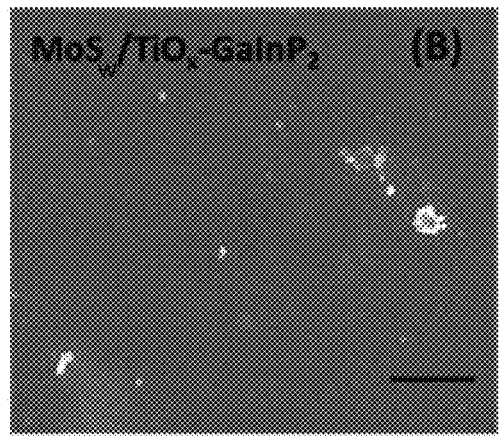
Figure 8:
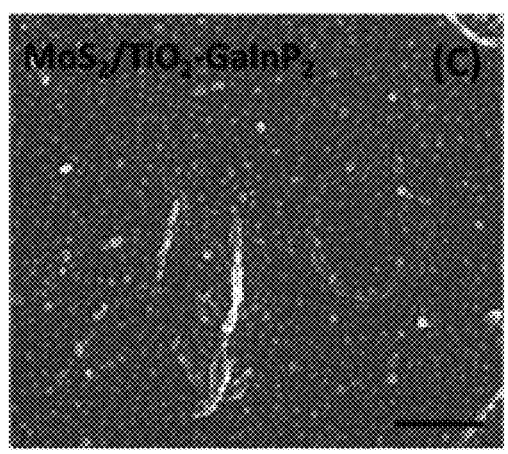
Figure 8:
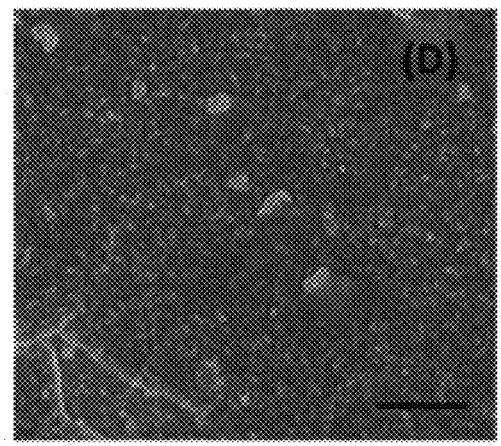

Longer-term stability of these three samples was monitored for 20 hours under sustained photoelectrolysis at 0 V vs. RHE. As can be seen from FIG. 3D, the photocurrent density of the unannealed electrode a-MoS$_w$/a-TiO$_x$—GaInP$_2$ decreased significantly, from 10 mA/cm$^2$ to 5 mA/cm$^2$, after 20 hours. This drop in photocurrent density is apparent both without any a-TiO$_x$ layer (MoS$_w$—GaInP$_2$, see FIGS. 4A, 4B, and 4C) or with annealed c-TiO$_2$ prior to electrodeposition of a-MoS$_w$ (a-MoS$_w$/c-TiO$_2$—GaInP$_2$, see FIGS. 5A and 5B), suggesting that the instability results from the a-MoS$_w$ layer. Interestingly, the majority of the decrease in photocurrent density from the a-MoS$_w$/c-TiO$_2$—GaInP$_2$ sample occurred within the first 10 hours, with relatively stable performance observed from 10 to 20 hours (see FIGS. 4A, 4B, and 4C). In contrast to unannealed a-MoS$_w$/a-TiO$_x$—GaInP$_2$, the high photocurrent density produced by g-MoS$_w$/c-TiO$_2$—GaInP$_2$ diminished by less than 20% over 20 h, which is also substantially better durability than that observed for the PtRu—GaInP$_2$ sample (see FIG. 3D). The instability of the latter appears to be related to the incomplete coverage of the PtRu alloy over the GaInP$_2$ surface, which forms small (1-10 nm) particles on GaInP$_2$ as evidenced by atomic contrast scanning transmission electron microscopy (STEM) imaging (see FIG. 6). Hydrogen production was confirmed by gas chromatography, which showed 94% Faradaic efficiency over the initial 6 hours of photoelectrolysis (see FIG. 7). After 20 hours, a turnover number (TON) of 367,000 and turnover frequency (TOF) of 5.1 s$^{-1}$ was calculated based on analysis of the catalyst loading (10.49 nmol/cm$^2$ or 1.68 µg/cm$^2$) using ICP-MS (see Table 1 below). SEM images of a-TiO$_x$—GaInP$_2$, a-MoS$_w$/a-TiO$_x$—GaInP$_2$, and g-MoS$_w$/c-TiO$_2$—GaInP$_2$ before and after 20 hours of electrolysis (see FIG. 8, Panels C and D, respectively). Following electrolysis, there is no discernible change in the MoS$_2$ particle size, though some unknown material appears to have deposited in a few small patches.

TABLE 1

TON and TOF of g-MoS$_w$/TiO$_2$—GaInP$_2$ and PtRu—GaInP$_2$ for 20 hours of electrolysis

| Sample | Catalyst Amount (ppb) | Area of the electrode used (cm$^2$) | Catalyst loading (nmol/cm$^2$) | Total Charge in 20 hours (Coulomb) | TON | TOF (s$^{-1}$) |
|---|---|---|---|---|---|---|
| g-MoS$_w$/c-TiO$_2$—GaInP$_2$ | 161 | 0.16 | 10.49 | 119 | 3.67E5 | 5.1 |
| PtRu—GaInP$_2$ | 102 | 0.15 | 3.5 | 74.25 | 7.4E5 | 10.25 |

Figure 9:
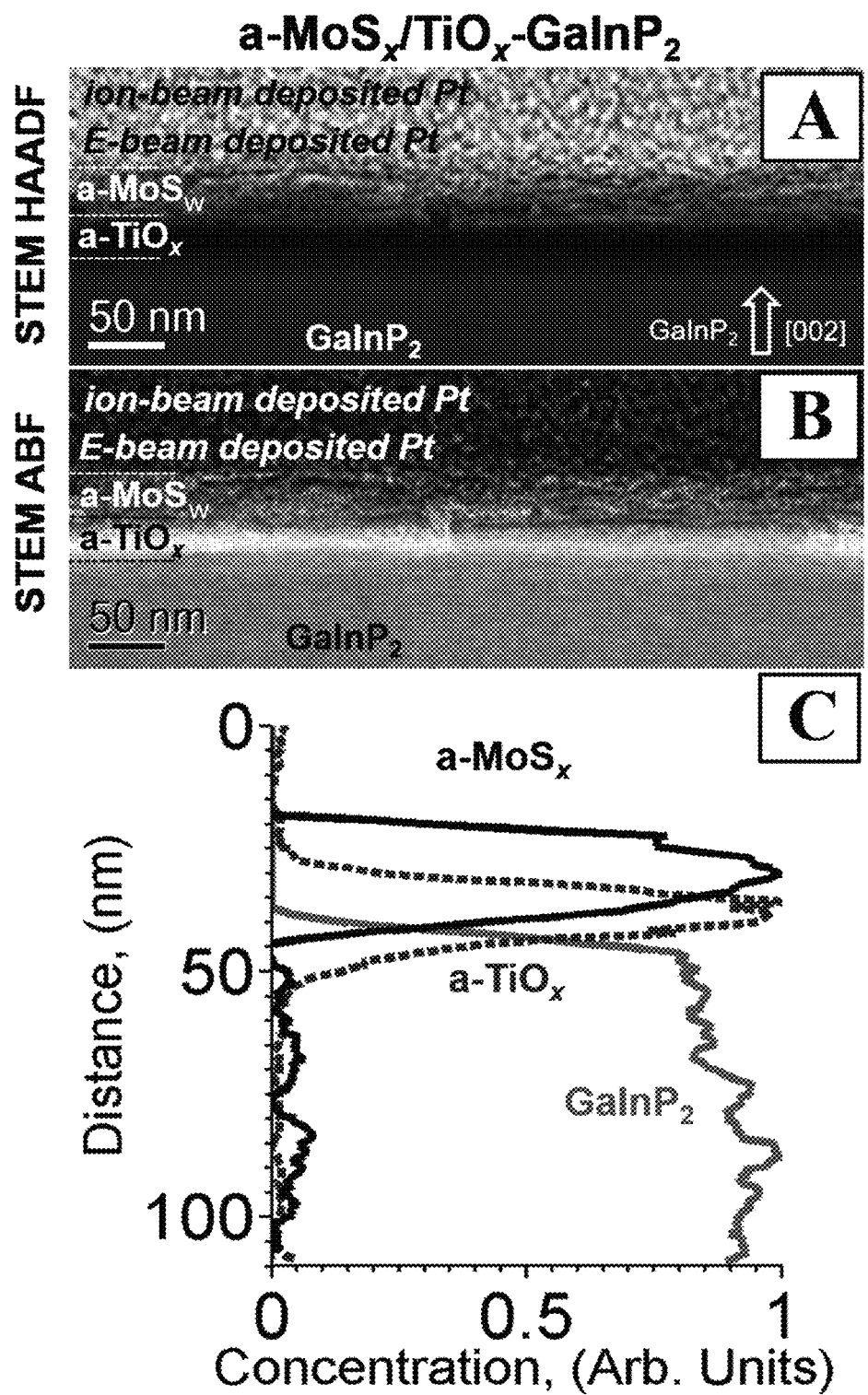
FIGS. 9 and 10 (Panels A through F) illustrate structural and chemical profiling of the non-annealed and annealed MoS$_w$/$TiO_x$—$GaInP_2$ electrodes, according to some embodiments of the present disclosure. (Panel A) Cross-sectional high-angle annular dark field (HAADF) and (Panel B) annular bright-field (ABF) STEM image of MoS$_w$/ $TiO_x$—$GaInP_2$ before annealing. (Panel C) STEM EDS line profiling coupled with spectral component matching showing the individual layer thickness and interface abruptness before annealing. (Panel D) Cross-sectional of HAADF and (Panel E) ABF STEM image of g-MoS$_w$/$TiO_2$—$GaInP_2$ after annealing. (Panel F) STEM EDS line profiling coupled with spectral component matching showing the individual layer thickness) and evidence of inter-diffusion between layers after annealing.
Figure 10:
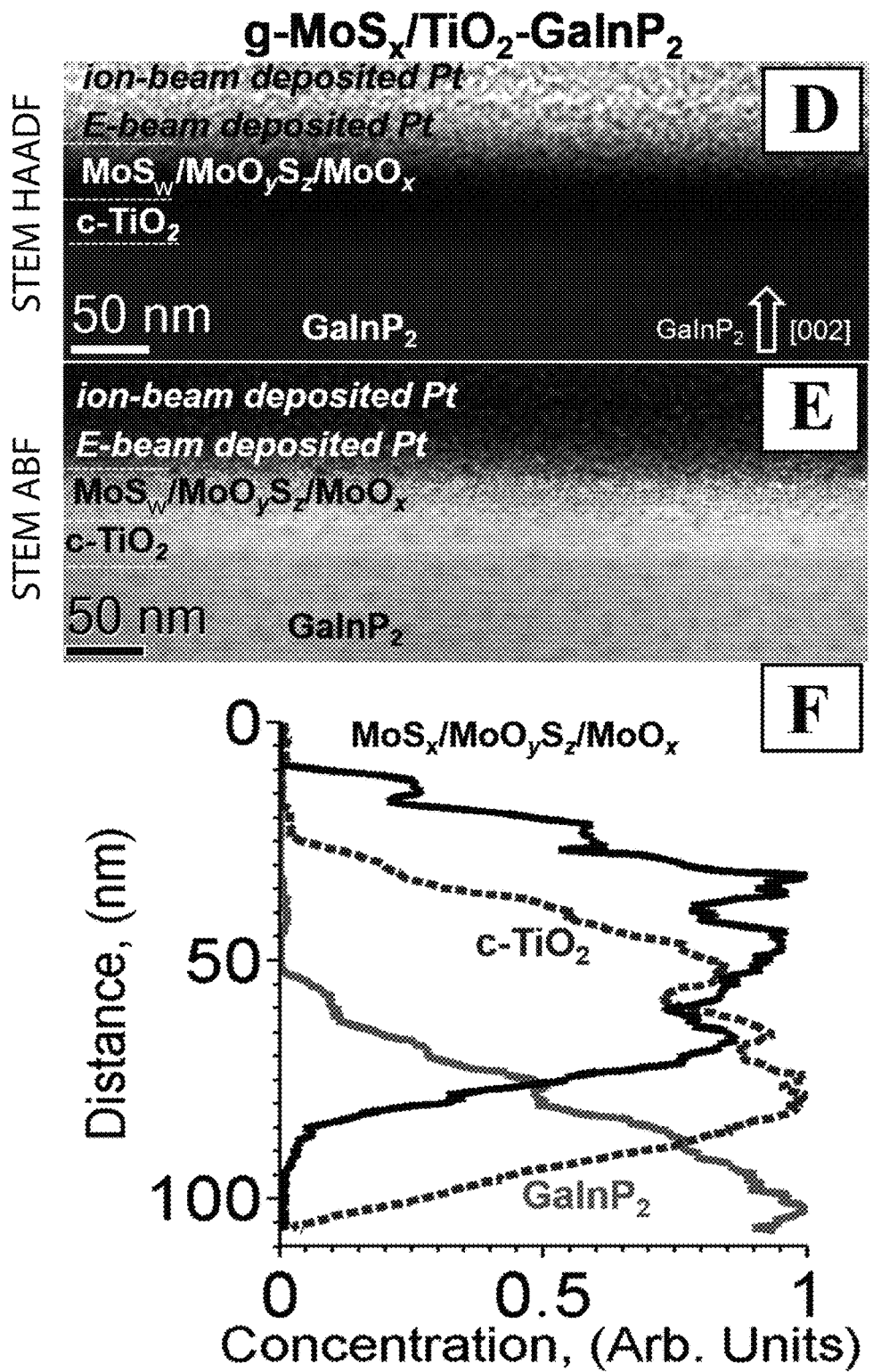
Figure 11:
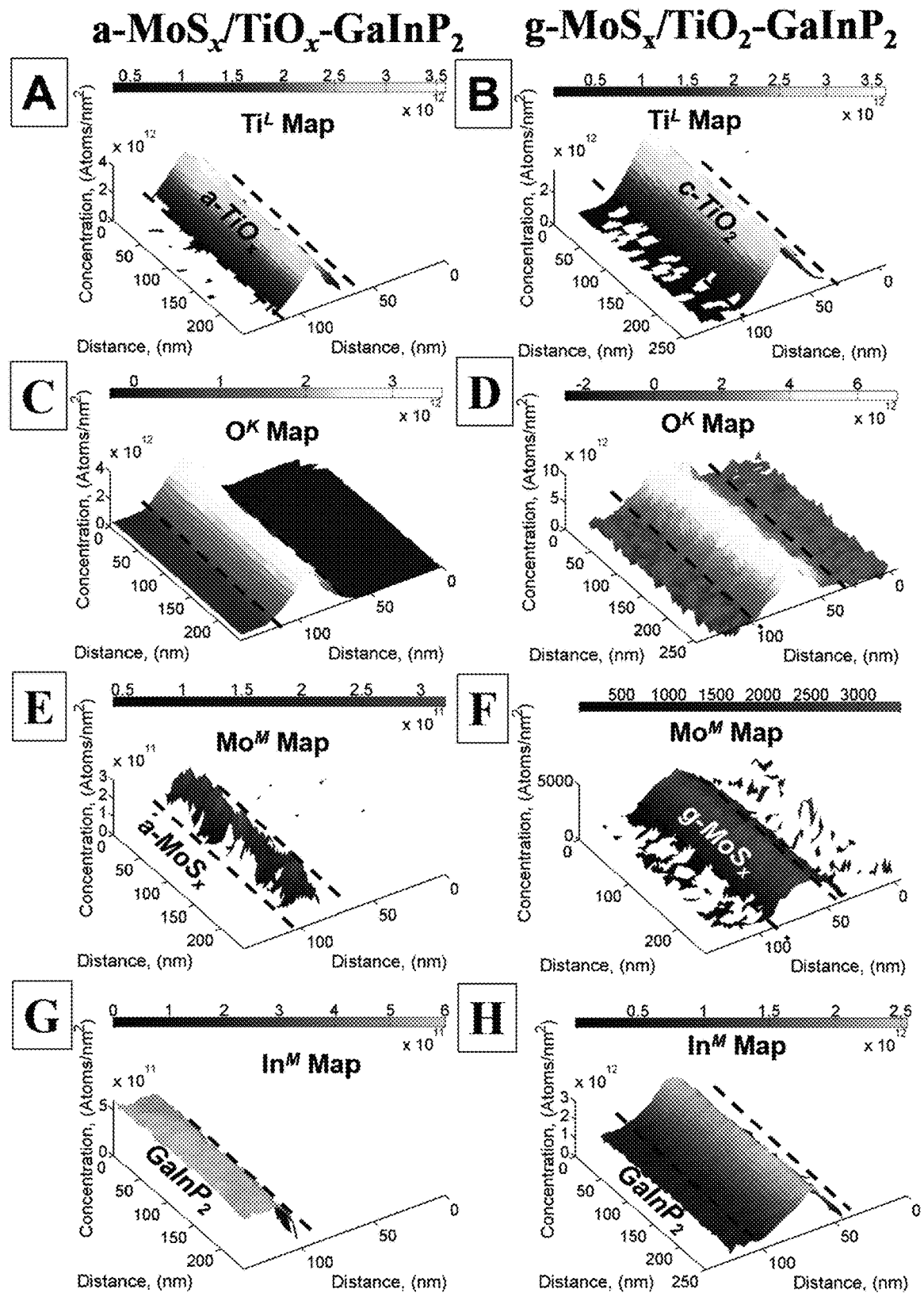
FIG. 11 illustrates chemical profiling of the non-annealed and annealed MoS$_w$/$TiO_x$—$GaInP_2$ electrodes, according to some embodiments of the present disclosure. The mapping shows the individual layer thickness associated with Ti, O, Mo and In elements. Integrated line plots and chemical analyses are used to show the layer topology associated with as-deposited sample MoS$_w$TiO$_x$—$GaInP_2$ (Panels A, B, C, D) and annealed g-MoS$_w$/$TiO_2$—$GaInP_2$ (Panels E, F, G, H) where each layer is delineated by the dashed lines based on the complementary STEM image. Each of these 3-dimensional surface plots are further reported in calculated atomic densities, where each plot is intensity color scaled to the total number of atoms per nm$^2$. The as-deposited sample for (Panel A) Ti, (Panel B) O, (Panel C) Mo, and (Panel D) In clearly delineates each layer. In the case of annealed sample, comparing each of EELS component maps for (Panel E) Ti, (Panel F) O, (Panel G) Mo, and (Panel H) In demonstrate there is a higher degree intermixing on the order of 5 nm between the annealed $TiO_2$ and $MoS_2$ layers.

Chemical Properties of g-MoS$_w$/MoO$_x$/c-TiO$_2$—GaInP$_2$:

These data demonstrate that the annealed g-MoS$_w$/MoO$_x$/c-TiO$_2$—GaInP$_2$ sample is similarly active for HER at short times and retains even more of its initial activity than PtRu—GaInP$_2$. We probed the chemical nature of the interface before and after annealing in more detail using TEM, STEM, EELS and XPS. FIG. 9, Panel B displays the cross-sectional STEM annular bright-field (ABF) image of an as-deposited a-MoS$_w$/a-TiO$_x$—GaInP$_2$ sample showing relatively well-defined layers of a-MoS$_w$, a-TiO$_x$, and GaInP$_2$ owing to uniform surface deposition. STEM-based EDS line profiling coupled with spectral component matching confirmed the sharp profiles of each layer (see FIG. 9, Panel C). Spectral component matching was performed by calculating the maximum spectrum from each area of the sample. This partitioning of the spectral dataset allows each component respective of each layer to be qualitatively plotted as an integrated profile for each of the components. In this manner, the individual groupings used and plotted are Ti/O, Mo/S, and In/Ga/P to determine layer thickness. The layer thicknesses of a-MoS$_w$ and a-TiO$_x$ were found to be 22-26 nm and 24-30 nm, respectively. In contrast, the STEM bright field image of the annealed sample g-MoS$_w$/c-TiO$_2$—GaInP$_2$ exhibited a much less well-defined interface, and EDS line profiling of this annealed sample indicated a large degree of interpenetration between g-MoS$_w$, c-TiO$_2$, and GaInP$_2$ (see FIG. 10, Panel F). STEM-EELS mapping was used to further probe the interface structure and also showed a clear difference in topology between as-deposited a-MoS$_w$ and a-TiO$_x$ (see FIG. 11, Panels A, C, E, and G) compared with the sample following annealing (see FIG. 11, Panels B, D, F, and H). Comparing the topology based on calculated 2-dimensional atomic densities, the as-deposited sample distribution for Ti (see FIG. 11, Panel A), O (see FIG. 11, Panel B), Mo (see FIG. 11, Panel C), and In (see FIG. 11, Panel D) resolves no significant layer to layer overlap. The STEM-EELS maps qualitatively agree with the EDS results, with the Ti, 0, Mo, and In maps showing however the annealed sample contains significantly more overlap between g-MoS$_w$/c-TiO$_2$ than between a-MoS$_w$/a-TiO$_x$ in the as-deposited sample. Specifically, the EELS component maps for g-MoS$_w$/c-TiO$_2$ demonstrate a higher degree of intermixing on the order of 5 nm between the annealed TiO$_2$ and MoS$_2$ layers based on the reported Ti (see FIG. 11, Panel E), O (see FIG. 11, Panel F), Mo (see FIG. 11, Panel G), and In (see FIG. 11, Panel H) calculated atomic density plots. We note the EELS fine structure is not presented due to overlapping between layers and different localized nanoscale chemistry rendering EELS insufficient for accurate valence state determination. Interestingly, the EELS In map additionally shows more In content near the sample surface and less approaching the GaInP$_2$ surface, suggesting that In also diffuses into the g-MoS$_w$/c-TiO$_2$ interfacial layer upon annealing.

Figure 12:
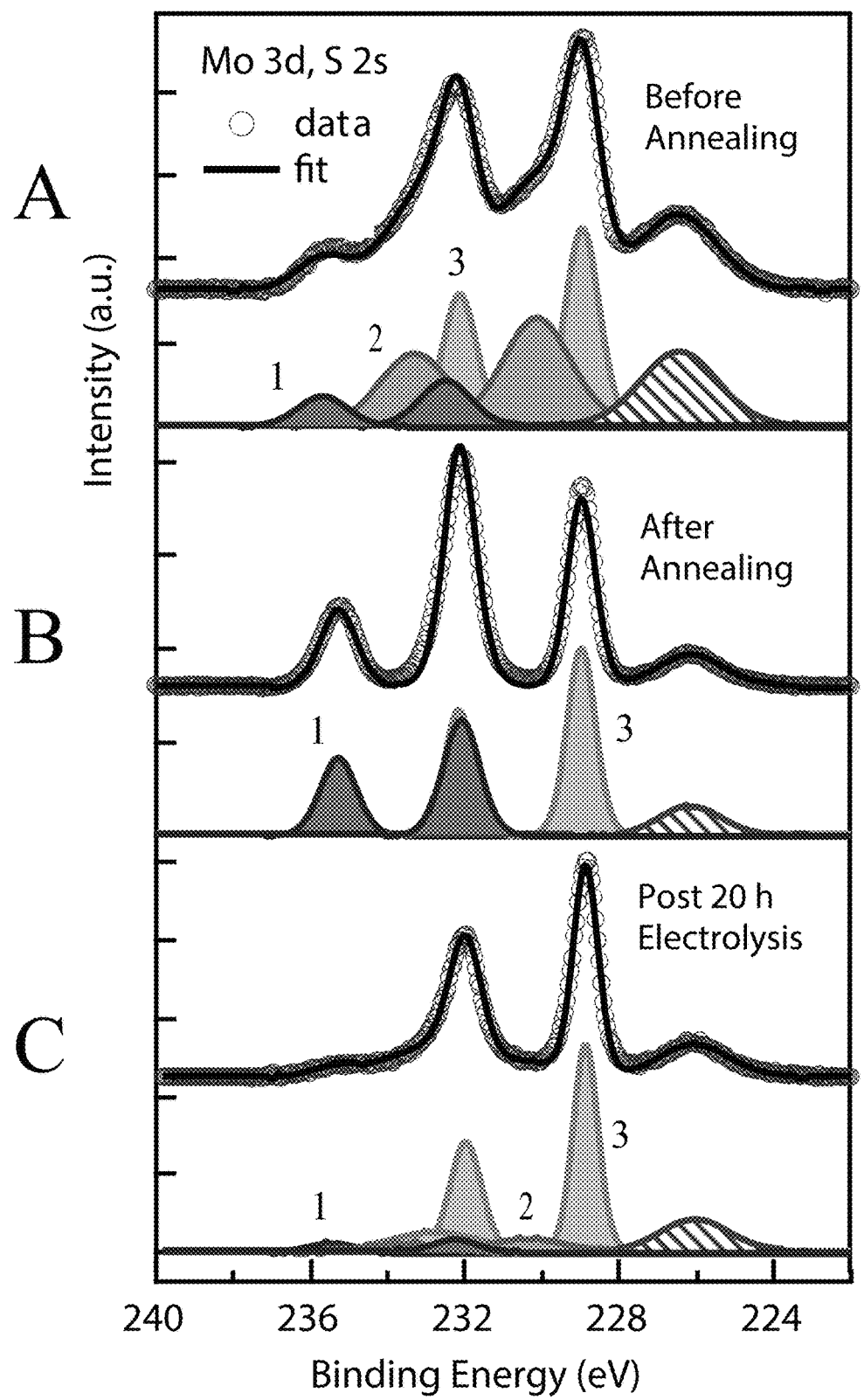
FIGS. 12 and 13 illustrates XPS spectra of MoS$_w$/$TiO_x$—$GaInP_2$ electrode before and after annealing and before and after electrolysis for 20 hours, according to some embodiments of the present disclosure. Panels A, B, C are XPS of Mo 3d, S 2s regions for (Panel A) a-MoS$_w$/a-$TiO_x$—$GaInP_2$, (Panel B) g-MoS$_w$/c-$TiO_2$—$GaInP_2$, and (Panel C) g-MoS$_w$/ c-$TiO_2$—$GaInP_2$ after 20 hours photoelectrolysis showing experimental data (circles), fitting envelope (solid line), and peak deconvolutions corresponding to Mo(IV) from MoS$_w$ (peaks indicated by "3"), Mo(V) from MoO$_y$S$_z$ (peaks indicated by "2"), Mo(VI) from MoO$_x$ (peaks indicated by "1"), various sulfur species (S$_2^{2-}$, S$^{2-}$, and another electron rich sulfur phase (e.g., S$^{2-}$ from residual (NH$_4$)S); hashed peaks), and S$^{6+}$ from sulfate (peaks indicated by "4"). D, E, F are XPS of S 2p region for (Panel D) a-MoS$_w$/a-$TiO_x$—$GaInP_2$, (Panel E) g-MoS$_w$/c-$TiO_2$—$GaInP_2$, and (Panel F) g-MoS$_w$/ c-$TiO_2$—$GaInP_2$ after 20 h photoelectrolysis showing experimental data, fitting envelope, and peak deconvolutions corresponding to S$^{6+}$ from sulfate, S$_2^{2-}$ (peaks indicated by 2), S$^{2-}$ (peaks indicated by "3"), S$^0$ (peaks indicated by "5"), and electron rich sulfur (peaks indicated by "1").

XPS analysis was used to further probe the chemical composition of the interfacial layer before and after annealing. Our XPS data for the as-deposited a-MoS$_w$/a-TiO$_x$—GaInP$_2$ sample (see FIG. 12, Panels A and B) shows chemical environments for Mo and S in this near-surface (7-9 nm) region. Fitting details for the Mo 3d and S 2p XPS data are provided below. Three Mo 3d doublets and one broad S 2s peak were combined to fit the Mo 3d spectra. The Mo 3d$_{5/2}$ binding energy of 228.7 eV (peaks labeled "3", FIG. 12, Panel A) is attributed to Mo(IV) (e.g., MoS$_2$ or MoS$_w$), and that at 230.5 eV (peaks labeled "2", FIG. 12, Panel A) to a Mo(V) phase that may be assigned as MoO$_y$S$_z$. The doublet with a Mo 3d$_{5/2}$ energy of 232.5 eV (peaks labeled "1", FIG. 12, Panel A) is due to Mo(VI), possibly due to formation of MoO$_3$. However, no crystalline MoO$_3$ were detected from the STEM ABF imaging on the annealed sample (see FIGS. 9 and 10), and thus we use MoO$_x$ to represent the Mo(VI) phases detected here. The S 2s peak at 226.0 eV (hashed peak, FIG. 12, Panel A) indicative of S$^{2-}$ is consistent with the formation of a Mo(IV) phase such as MoS$_w$. The S 2p spectrum (see FIG. 12, Panel B) was deconstructed into three doublets assigned to S$_2^{2-}$ (162.4 eV) and S$^{2-}$ (161.7 eV) as well as another electron rich sulfur phase (161.2 eV, e.g., S$^{2-}$ from residual precursor (NH$_4$S) consistent with the Mo(IV), Mo(V), and Mo(VI) phases found in the Mo 3d region.

After annealing, the XPS spectra change dramatically to eliminate the Mo(V) spectral intensity. The Mo 3d region for the g-MoS$_w$/TiO$_2$—GaInP$_2$ electrode (see FIG. 12 Panel C) exhibits just two Mo oxidation states as evidenced by doublets with Mo 3d$_{3/2}$ of 228.7 eV (green peaks) and 232.5 eV (purple peaks) indicative of a MoS$_w$ phase similar to crystalline Mo(IV) (MoS$_2$) and Mo(VI) (MoO$_x$), respectively, as described above, and the corresponding S 2p spectrum (see FIG. 13, Panel D) stems entirely from S$^{2-}$ species. Interestingly, the relative amount of Mo(VI) increases substantially, which suggests that annealing under inert atmosphere (Ar, 4 hour, 450° C.) causes oxidation of the Mo(V) phases to Mo(VI) and complete conversion of undercoordinated and unreacted sulfur. These data are consistent with the STEM-based EDS and EELS chemical mapping data that show an as-deposited a-MoS$_w$/a-TiO$_x$ interface that becomes graded with formation of g-MoS$_w$, MoO$_x$, and TiO$_2$ inter-mixed phases.

Figure 13:
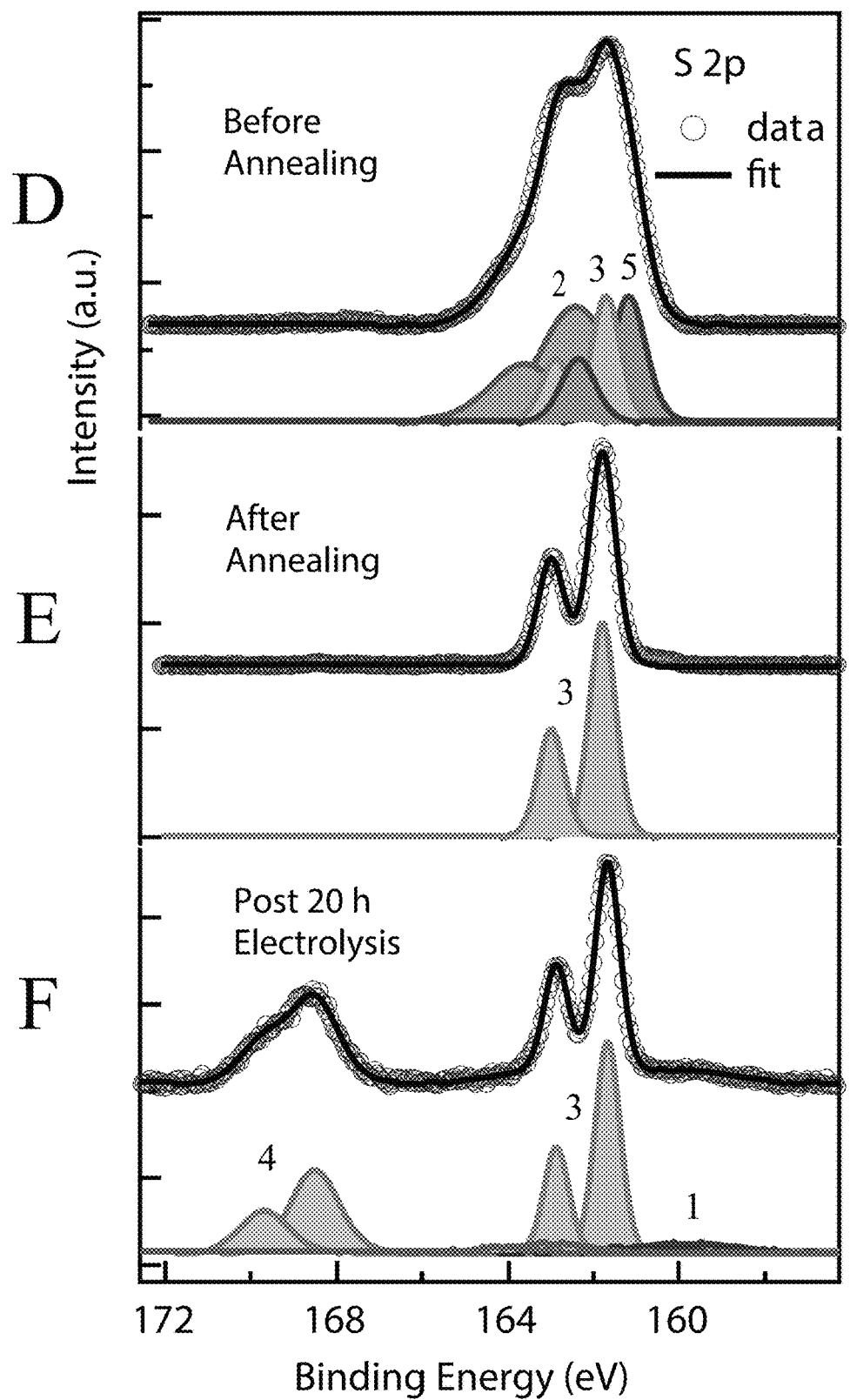

Finally, a sample via XPS after 20 hours of photoelectrolysis demonstrates a significantly decreased intensity peak from Mo(VI), likely due to MoO$_x$ dissolution in acid with extended electrolysis, and similar intensity Mo(IV) and S$^{2-}$ peaks, indicative of MoS$_2$, but also a small amount of Mo(V) (see FIG. 13, Panel E). Additional peaks were observed attributable to sulfate (grey S 2p doublet at 168.5 eV, FIG. 13, Panel F; S 2s peak labeled "4" at 232.8 eV, FIG. 13, Panel E) as well as trace of a highly reduced sulfur species (S 2p purple doublet at 159.8 eV, FIG. 13, Panel F). Dissolution of MoO$_x$ and re-deposition as MoO$_y$S$_z$ or sulfate could be responsible for the observed material on the electrode surface following photoelectrolysis (SEM image, FIG. 8, Panel D).

These observations suggest that the stability induced by annealing could result from the formation of a crystalline $MoS_2$ phase, suitable for use as a HER catalyst with excellent catalytic stability and/or the g-$MoS_w$/$MoO_x$/$TiO_2$ hybrid structure improving the interface corrosion resistance in strong acid and improving catalyst adhesion on top of the protection layer. This is in contrast to other molybdenum sulfide catalyst-protected photocathode interfaces without additional metal interface (such as a $MoS_2$/$TiO_2$-nanowired Si system), the g-$MoS_w$/c-$TiO_2$ interface demonstrated a more positive onset potential (0.5 V vs. RHE) and stability (20 h) in strong acid solution (see Table 2 below). In addition, the hybridization between the molybdenum oxide species and $MoS_2$ might improve $MoS_2$ catalyst's conductivity and diffusion properties.

TABLE 2

Summary of activity and stability of photocathodes modified by molybdenum sulfide

| Light Absorber | HER catalyst | $j_0$ (0 V vs. RHE, mA·cm$^{-2}$) | Stability$^a$ at 0 V vs. RHE | Photo-current onset (vs. RHE) |
|---|---|---|---|---|
| $Cu_2O$/AZO/$TiO_2$ | $MoS_{2+X}$ | −5.6 | 5 h at pH 1 | 0.45 V |
|  |  | −4.5 | 10 h at pH 4 |  |
|  |  | −2.0 | 10 h at pH 9 |  |
| Ti-n$^+$p-Si | $MoS_x$ | −14 | 1 h at pH 0 (+0.2 V vs. RHE) | 0.33 V |
| Si-nano wires | $MoS_2$ | −1 | 1 h at pH 5.0 | 0.25 V |
| Si pillars | $Mo_3S_4$ cluster | −9 | 24 h light/dark cycle at pH 0 | 0.15 |
| n$^+$p-Si | $MoS_2$/Mo | −10 | 5 d in 1 M $HClO_4$ | 0.30 V |
|  | $MoS_x$/$MoS_2$/Mo | −12 | 24 h in 1 M $HClO_4$(+0.2 V vs. RHE) | 0.34 V |
| P3HT: PCBM | $MoS_x$ | −0.2 | 45 min in 0.5 M $H_2SO_4$(+0.16 V vs. RHE) | 0.50 V |
| Si | Pt/$MoS_2$/$Al_2O_3$ | −25 | 40 h in 1 M $HClO_4$ | 0.30 V |
| Si | $MoS_2$/$TiO_2$ | −21 | 75 min in 0.5 M $H_2SO_4$(at −0.33 V vs. RHE) | 0.30 V |
| $GaInP_2$ | g-$MoS_x$/$TiO_2$ | −11 | 20 h at pH 0 | 0.50 V |

In conclusion, a g-$MoS_w$/c-$TiO_2$-$GanP_2$ photocathode for efficient water reduction was demonstrated with just a 20% loss in photocurrent density and a catalyst TON of 367,000 and TOF of 5.1 s$^{-1}$ under sustained photoelectrolysis for 20 hours at 0 V vs. RHE in strong acid. High durability, exceeding that of a PtRu-sputtered $GaInP_2$ photoelectrode, is obtained by annealing the as-deposited $MoS_w$/$TiO_x$ interfacial layers. The structure and chemical composition of the photoelectrode after annealing was analysed by TEM, STEM, EDS, EELS, and XPS and revealed a graded catalytic-protective layer. We propose that the high activity and stability of this system results from the formation g-$MoS_w$ that retains much of the high catalytic activity of amorphous $MoS_w$ owing to the unique graded interface with $MoO_x$ and $TiO_2$.

Methods:

$GaInP_2$ Photoelectrode:

The epi layer of $GaInP_2$ were grown on GaAs substrates by an atmospheric pressure organometallic vapor-phase epitaxial method. The thickness of the epitaxial $GaInP_2$ layer was 0.5-2 µm and the carrier concentration was 2×10$^{17}$ cm$^{-3}$.

Electron Microscopy:

STEM is a method that enables direct imaging and microanalysis of chemistry and structure extending below 1 nm. Using both STEM coupled with spectroscopies such as electron energy loss spectroscopy (EELS) and energy dispersive x-ray spectroscopy (EDS) couples the high spatial resolution of the STEM with the chemical certainty to detect elements within 2-3 atomic % and less pending on the element and its environment. To perform this level of characterization, however samples for STEM analysis need to be electron transparent. This requirement means the sample needs to be thinned to less than 100 nm, in order to be imaged. In the case of studying $MoS_w$/$TiO_x$/$GaInP_2$ and $MoS_2$/$TiO_2$/$InGaP_2$ layers, both the raw and annealed samples were lifted-out, mounted on copper OmniProbe grids, and further thinned to electron-transparency (<80 nm) inside a focused-ion beam instrument (FIB). Following this, a final polish using a 600 eV argon beam at ±10° was performed to remove excess damage introduced from the high-energy (5 kV) Ga$^+$ ions used during the final stage of the FIB procedure. Both elastically scattered electrons and inelastic electrons were collected to form both simultaneous bright field (BF) and annular dark field (ADF) atomic contrast STEM images with nearly a 1.63 Å probe at an operating acceleration voltage of 200 kV on a FEI Tecnai F20 Ultra Twin Field Emitting Gun (FEG) STEM located at the National Renewable Energy Laboratory (NREL). Under these conditions, we performed imaging and energy dispersive x-ray spectroscopy (EDS) with an energy dispersion of 10 eV/channel with a 50 µs time constant and 3 s dwell time. In the EDX measuring, a field of view measuring 250 nm×150 nm with a sub nanometer pixel size was integrated for tracking the chemical profile between these samples (only up to 110 nm is shown in the chemical profiles in FIGS. 9 and 10. To form the EDS line profiles shown we acquired the Ga—K, In-L, P—K, Mo—K, S—K, Ti—K, and O—K x-ray emission lines. The EDS line profiles based on these spectra were then compiled and processed as components matching $GaInP_2$, $TiO_x$, $MoS_w$. Final integrated profiles were also processed by horizontal summing; deviations were calculated based on statistics of standard deviations along defined horizontal line-profiles. EELS experiments using an aberration corrected FEI Titan G2 S (operated at 300 kV) equipped with a Gatan Quantum GIF with high-resolution EELS capabilities, allowing for the use of an electron beam with better than 980 meV energy resolution based on the full-width half maximum of the zero-loss energy peak. Drift corrected 2-dimensional spectral images were collected parallel and perpendicular to the layers. Based on the Mo—K/L, S—K, Ti-L, and O—K ionization edges, the electron energy loss near edge fine structure was quantified based on fitted known Hartree Slater partial cross sections at 300 kV with a 26 mrad semi-collection angle using the Gatan Digital Micrograph software. For FIGS. 9 and 10 TEM spectroscopy, the contrast is indeed fairly similar for each of the layers. In order for better identifying between each layer, imaging modalities, STEM annular bright and high angle annular dark field is added.

A plan-view TEM sample of a PtRu $GaInP_2$ electrode was prepared by mechanical polishing the sample from substrate side to about 10 μm thickness and then final thinning to electron transparency from the substrate side in an $Ar^+$ ion mill. The conditions used were: ion energy 3.5 kV; 13° incidence angle; the sample rotated and cooled using a liquid nitrogen cold stage; and using one ion gun with the $GaInP_2$ surface protected from re-deposition of ion sputtered material by a glass cover slip. The thinned sample was then examined by STEM high angle annular dark field (HAADF) using the FEI Tecnai F20 Ultra Twin FEG STEM at NREL operated at 200 kV. Bright field TEM images were obtained using an FEI Tecnai Super Twin TEM at NREL operated at 300 kV.

Inductively Coupled Plasma Mass Spectrometry:

The inductively coupled plasma mass spectrometry (ICP-MS) experiment was conducted on Thermo Scientific ICAP Q instrument with CETAC ASX-520 auto sampler. Molybdenum, platinum and ruthenium standard were prepared from Inorganic Ventures MS Mo-10 ppm, Pt-10 ppm and Ru-10 ppm, respectively. The samples were run in standard (STD) mode with Collision Cell Technology (CCT). The ICP-MS samples were prepared by immersing a $GaInP_2$—$TiO_2$—$MoS_w$ or $GaInP_2$—Pt—Ru electrode into digested in aqua regia solution (0.58 ml) for overnight and diluted into 30 ml for analyzing.

Photoelectrochemical Measurement:

Linear sweep voltammetry data were collected using EG&G Princeton Applied Research VersaStat II potentiostat with a 300 W Xe-arc lamp (Newport). Intensity of light was calibrated by a using $GaInP_2$ photodiode (Eg=1.82 eV) whose short-circuit current was measured under AM1.5G (NREL). Noted that slight variations in sample position and light intensity measurement might lead to illumination intensities with an at least 10% error as shown by the limited photocurrent differences.[9] Photocathodic durability electrolysis experiments were performed in a H-cell incorporating a salt bridge isolated by glass frit in between the electrolysis compartment. For electrolysis lasting for 20 h, a steady DC-powered 250-W tungsten-halogen (Oriel model 66183) lamp with a water filter blocking IR irradiation was used as the light source, a $GaInP_2$ photoelectrode was placed in the same compartment with the Ag/AgCl reference and Pt counter electrode in the auxiliary compartment. The headspace of the cell was continuously purged with Ar. A gas tight electrochemical setup was applied to collect and measure the increased volume caused by $H_2$ production with a volumetric pipette. The collected gas was further measured by gas chromatography (Shimadzu GC-2010 Plus) with a Carbxen™ 1010 PLOT column and a thermal conductivity detector (TCD). The gas product was further confirmed to be $H_2$.

Electrode Fabrication and Deposition of a-$MoS_w$ Films:

Ohmic contacts were made by sputtering gold layers (100 nm thick) onto the opposing sides of the sample and attaching copper wires through silver paste (PELCO colloid silver). The assembly was then covered by a glass and sealed with insulating epoxy (Loctite 9462 Hysol) at room temperature for overnight. Further, an acid resistant epoxy (Loctite E-120 HP), cured at room temperature for overnight, was applied to prevent the epoxy layer from etching by the acid solution. Amorphous molybdenum sulfide thin films were prepared by reductive electrodeposition at –0.3 V vs. Ag/AgCl from aqueous solution containing 5 mM of $[(NH_4)_2MoS_4]$ and 0.5 M $Na_2SO_4$ under 1 sun illumination for 1200 s. After film preparation, electrode was removed from the prepared media and washed with 100 ml distilled water. Further the electrode was dissembled from the epoxy cover and annealed in Ar atmosphere for 4 hours at 450° C. Similar procedure as previously described was applied to reassemble the annealed $GaInP_2$ electrode.

IPCE Measurement:

Incident photon-to-current efficiency (IPCE) was performed in a three-electrode configuration, with Ag/AgCl as reference electrode and a Pt foil counter electrode, in 0.5 M $H_2SO_4$ aqueous solution (pH 0.3) electrolyte at –0.2 V vs. Ag/AgCl (0 V vs. RHE). The sequence at each wavelength was 6 s of dark, following 4 s of illumination. The current was collected at 10 points per s, with the final 10 points of each light and dark cycle averaged. For each data point at one wavelength, photocurrent was obtained from light current subtracted the dark current. Sample photocurrent data was normalized to the output of a calibrated silicon photo-diode (Hamamatsu, A02 S1336-8BQB) outside the solution. Each plot was obtained by the average value of two experiments.

X-Ray Photoelectron Spectroscopy Measurement:

Photoelectron spectroscopy was performed on a Kratos AXIS Nova or Physical Electronics (PHI) 5600 system depending on instrument availability. In either case, photoelectrons were generated using monochromatic Al Kα X-rays at 1486.6 eV. Base pressures were better than $1\times10^{-9}$ torr. Binding Energy calibrations were performed by comparing measured Au 4f 7/2, Ag 3d 5/2 and Cu 2p 3/2 core level spectra from clean metal foils and the accepted centroid positions reported by Seah.[40] For E3 samples that exhibited slight charging during measurement, the C is peak was referenced to 284.6 eV. Least squares fitting of XPS data was done using CasaXPS software with combinations of Gaussian (80%) and Lorentzian (20%) peak shapes. Constraints on the Mo $3d_{5/2}$ and $3d_{3/2}$ peaks included peak splitting of 3.18 eV and an intensity ratio of 3:2 respectively. Constraints on the S $2p_{3/2}$ and $2p_{1/2}$ peaks included peak splitting of 1.20 eV and an intensity ratio of 2:1 respectively. Calculations were performed using the TPP-2 formula for electron effective attenuation lengths (EAL). The resulting thicknesses assumed a dense $MoS_2$ coating and used the National Institute of Standards and Technology (NIST) EAL database with inputs: $MoS_2$ density=5.06 g/cm3, asymmetry (beta parameter)=1.18 averaged between Mo 3d5/2 and S2p 3/2 orbitals, KE=1300 eV, valence=18, Eg=1.23 eV and using our XPS setup geometry. These calculations indicate that the photoelectron signal attenuation reaches 99% at a film thickness of 10.0 nm. For a $MoS_2$ thickness of 6.5 nm the signal is attenuated by 95%. Hence, with a calculated effective attenuation length of 2.193 nm, and very good fits to the XPS data, the analysis presented represents the top 10 nm of the coating.

Scanning Electron Microscope Measurement:

The surface morphology of the $TiO_2$ modified $GaInP_2$ electrode or Pt catalyst modified $GaInP_2$ was analyzed using a FE-SEM, JEOL JSM 7000F field emission scanning electron microscope (FESEM) operated at 5 kV. Characterization of the $GaInP_2$—$TiO_2$—$MoS_2/MoO_3$ surface before and after annealing indicates the formation of more defined surface grains, with sizes of 100-200 nm after annealing, as shown by SEM measurements (see FIG. 8).

Atomic Layer Deposition of $TiO_2$:

The $TiO_2$ was deposited onto the $GaInP_2$ following a published procedure. 24-30 nm of $TiO_2$ was deposited onto $GaInP_2$ surface to protect the surface from corrosion. The thickness of $TiO_2$ layer was characterized by STEM.

Sputtering of Platinum and Ruthenium:

The samples were mounted to a wheel inside the sputtering chamber. The wheel serves two purposes: 1) to move the samples out of the way (to the top of the wheel) while the sputter head is being warmed up or powered down and 2) to pass the samples through the sputtering plume at a defined rate. With samples mounted, the chamber is evacuated to ~$1\times10^{-6}$ Torr base pressure before introducing and maintaining 10 mTorr argon background. With samples in the "up" position, the sputter head power supply is adjusted to 20 W DC, establishing an Ar plasma, which is allowed to stabilize for 2 min. Then, Pt/Ru sputtering proceeds as two wheel rotations at 15 rpm so that the samples pass underneath the sputter head twice.

Determination of the Turnover Number and Turnover Frequency:

After the catalyst loading amount was determined by ICP-MS, the turnover number was calculated by the following equation:

$$= \frac{C}{2Fn},$$

were C is the Coulomb passed during the electrolysis process. F is Faraday Constant in C/mol. n is mole amount of catalyst deposited on top of the electrode surface. TOF is determined by TON per second.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

EXAMPLES

Example 1

A composition comprising, in order: a first layer comprising $MA_w$; a second layer comprising $MO_yA_z$; and a third layer comprising $MO_x$, wherein: M comprises a transition metal, A comprises at least one of sulfur, selenium, or tellurium, w is between greater than zero and less than or equal to five, x is between greater than zero and less than or equal to five, y is between greater than zero and less than or equal to five, and z is between greater than zero and less than or equal to five.

Example 2

The composition of Example 1, wherein the transition metal comprises at least one of molybdenum or tungsten.

Example 3

The composition of Example 1, wherein A is sulfur.

Example 4

The composition of Example 1, wherein the first layer comprises $MoS_w$.

Example 5

The composition of Example 1, wherein the second layer comprises $MoO_yS_z$.

Example 6

The composition of Example 1, wherein the third layer comprises $MoO_x$.

Example 7

The composition of Example 1, wherein w is between greater than one and less than or equal to three.

Example 8

The composition of Example 1, further comprising: a first transition layer positioned between the first layer and the second layer, wherein: the transition layer contains intermixed $MA_w$ and $MO_yA_z$.

Example 9

The composition of Example 1, further comprising: a first transition layer positioned between the second layer and the third layer, wherein: the transition layer contains intermixed $MO_yA_z$ and $MO_x$.

Example 10

The composition of Example 9, further comprising: a second transition layer positioned between the second layer and the third layer, wherein: the transition layer contains intermixed $MO_yA_z$ and $MO_x$.

Example 11

The composition of Example 1, wherein the first layer, the second layer, and the third layer are all at least partially intermixed.

Example 12

The composition of Example 1, wherein at least one of the first layer, the second layer, and the third layer is at least partially crystalline.

Example 13

The composition of Example 1, wherein the first layer has a thickness between 1 µm and 100 µm.

Example 14

The composition of Example 13, wherein the first layer has a thickness between 1 nm and 100 nm.

Example 15

The composition of Example 1, wherein the second layer has a thickness between 1 µm and 100 µm.

Example 16

The composition of Example 15, wherein the second layer has a thickness between 1 nm and 100 nm.

Example 17

The composition of Example 1, wherein the third layer has a thickness between 1 µm and 100 µm.

Example 18

The composition of Example 17, wherein the third layer has a thickness between 1 nm and 100 nm.

Example 19

The composition of Example 1, wherein the first layer, the second layer, and the third layer have a combined thickness between 1 µm and 1000 µm.

Example 20

The composition of Example 1, further comprising: an oxide layer, wherein the third layer is positioned between the oxide layer and the second layer.

Example 21

The composition of Example 20, wherein the oxide layer comprises at least one of titanium oxide, aluminum oxide, or zinc oxide.

Example 22

The composition of Example 20, wherein the oxide layer is substantially crystalline.

Example 23

The composition of Example 21, wherein the oxide layer has a thickness between 1 nm and 100 nm.

Example 24

The composition of Example 20, further comprising: an active layer comprising a group III-V alloy, wherein the oxide layer is positioned between the active layer and third layer.

Example 25

The composition of Example 24, wherein the active layer comprises at least one of GaN, GaP, GaAs, InP, InAs, AlGaAs, InGaAs, AlInAs, AlInSb, GaAsN, GaAsP, AlGaN, AlGaP, InGaN, or InAsSb.

Example 26

The composition of Example 24, wherein: the active layer comprises $Ga_vIn_{1-v}P$, and v is between greater than zero and less than one.

Example 27

The composition of Example 24, wherein the active layer comprises $GaInP_2$.

28

A composition comprising, in order: a first layer comprising $MoS_w$; a second layer comprising $MoO_yS_z$; and a third layer comprising $MoO_x$, wherein: wherein M comprises a transition metal, A comprises at least one of sulfur, selenium, or tellurium, w is between greater than zero and less than or equal to five, x is between greater than zero and less than or equal to five, y is between greater than zero and less than or equal to five, and z is between greater than zero and less than or equal to five

Example 29

A method comprising, in order: depositing a starting layer comprising $MA_v$ onto an oxide layer; and annealing the starting layer and the oxide layer, wherein: v is between greater than zero and less than or equal to five, and the annealing transforms the starting layer to a graded layer comprising, in order: a first layer comprising $MA_w$; a second layer comprising $MO_yA_z$; and a third layer comprising $MO_x$, wherein: wherein M comprises a transition metal, A comprises at least one of sulfur, selenium, or tellurium, w is between greater than zero and less than or equal to five, x is between greater than zero and less than or equal to five, y is between greater than zero and less than or equal to five, and z is between greater than zero and less than or equal to five.

Example 30

The method of Example 29, wherein the depositing is performed by at least one of a vapor deposition method or a solution method.

Example 31

The method of Example 29, wherein the depositing is performed by electrochemical cathodic deposition.

Example 32

The method of Example 29, wherein: before the annealing, the oxide layer and the starting layer are substantially amorphous, and after the annealing, the oxide layer and the starting layer are substantially crystalline.

Example 33

The method of Example 29, wherein the annealing is performed by heating the starting layer and the oxide layer to a temperature between 200° C. and 1000° C.

Example 34

The method of Example 33, wherein the temperature is between 300° C. and 600° C.

Example 35

The method of Example 34, wherein the annealing is performed by maintaining the starting layer and the oxide layer at the temperature for a period of time between one minute and 12 hours.

Example 36

The method of Example 35, wherein the period of time is between one hour and six hours.

Example 37

The method of Example 29, wherein the annealing is performed in an inert environment.

Example 38

The method of Example 37, wherein the inert environment comprises argon.

Example 39

A method for photoelectrochemical water-splitting, the method comprising: contacting a device with water; and exposing the device to a light, wherein: the contacting and the exposing convert at least a portion of the water to hydrogen ($H_2$), and the device comprises: a first layer comprising $MA_w$; a second layer comprising $MO_yA_z$; and a third layer comprising $MO_x$, wherein: wherein M comprises a transition metal, A comprises at least one of sulfur, selenium, or tellurium, w is between greater than zero and less than or equal to five, x is between greater than zero and less than or equal to five, y is between greater than zero and less than or equal to five, and z is between greater than zero and less than or equal to five.

Example 40

The method of Example 39, wherein the contacting and exposing further convert at least a portion of the water to oxygen ($O_2$).

Example 41

The method of Example 39, wherein: the device comprises a photocathode, and the photocathode comprises the first layer, the second layer, and the third layer.

Example 42

The method of Example 41, wherein the photocathode converts the water to $H_2$ by the reaction $2H^+ + 2e^- \rightarrow H_2$.

Example 43

The method of Example 39, wherein the water is an acidic electrolyte.

What is claimed is:

1. A composition comprising, in order:
   a first layer comprising $MA_w$;
   a second layer comprising $MO_yA_z$; and
   a third layer comprising $MO_x$, wherein:
   M comprises a transition metal,
   A comprises at least one of sulfur, selenium, or tellurium,
   w is between greater than zero and less than or equal to five,
   x is between greater than zero and less than or equal to five,
   y is between greater than zero and less than or equal to five, and
   z is between greater than zero and less than or equal to five.

2. The composition of claim 1, wherein the transition metal comprises at least one of molybdenum or tungsten.

3. The composition of claim 1, wherein A is sulfur.

4. The composition of claim 1, wherein the first layer comprises $MoS_w$.

5. The composition of claim 1, wherein the second layer comprises $MoO_yS_z$.

6. The composition of claim 1, wherein the third layer comprises $MoO_x$.

7. The composition of claim 1, wherein w is between greater than one and less than or equal to three.

8. The composition of claim 1, further comprising:
   a first transition layer positioned between the first layer and the second layer, wherein:
   the transition layer contains intermixed $MA_w$ and $MO_yA_z$.

9. The composition of claim 1, further comprising:
   a first transition layer positioned between the second layer and the third layer, wherein:
   the transition layer contains intermixed $MO_yA_z$ and $MO_x$.

10. The composition of claim 1, wherein the first layer, the second layer, and the third layer are all at least partially intermixed.

11. The composition of claim 1, wherein at least one of the first layer, the second layer, and the third layer is at least partially crystalline.

12. The composition of claim 1, wherein the first layer has a thickness between 1 μm and 100 μm.

13. The composition of claim 1, wherein the second layer has a thickness between 1 μm and 100 μm.

14. The composition of claim 1, wherein the third layer has a thickness between 1 μm and 100 μm.

15. The composition of claim 1, further comprising:
an oxide layer, wherein the third layer is positioned between the oxide layer and the second layer.

16. The composition of claim 15, wherein the oxide layer comprises at least one of titanium oxide, aluminum oxide, or zinc oxide.

17. The composition of claim 15, further comprising:
an active layer comprising a group III-V alloy, wherein the oxide layer is positioned between the active layer and third layer.

18. A method comprising, in order:
depositing a starting layer comprising $MA_v$ onto an oxide layer; and annealing the starting layer and the oxide layer, wherein:
v is between greater than zero and less than or equal to five, and
the annealing transforms the starting layer to a graded layer comprising, in order:
a first layer comprising $MA_w$;
a second layer comprising $MO_yA_z$; and
a third layer comprising $MO_x$, wherein:
M comprises a transition metal,
A comprises at least one of sulfur, selenium, or tellurium,
w is between greater than zero and less than or equal to five,
x is between greater than zero and less than or equal to five,
y is between greater than zero and less than or equal to five, and
z is between greater than zero and less than or equal to five.

19. The method of claim 18, wherein the depositing is performed by electrochemical cathodic deposition.

20. A method for photoelectrochemical water-splitting, the method comprising:
contacting a device with water; and
exposing the device to a lightsource, wherein:
the contacting and the exposing convert at least a portion of the water to hydrogen, and
the device comprises:
a first layer comprising $MA_w$;
a second layer comprising $MO_yA_z$; and
a third layer comprising $MO_x$, wherein:
A comprises a transition metal,
w is between greater than zero and less than or equal to five,
x is between greater than zero and less than or equal to five,
y is between greater than zero and less than or equal to five, and
z is between greater than zero and less than or equal to five.

* * * * *